United States Patent
Yabu et al.

(10) Patent No.: US 8,698,112 B2
(45) Date of Patent: Apr. 15, 2014

(54) EXTREME ULTRAVIOLET LIGHT GENERATION APPARATUS

(75) Inventors: Takayuki Yabu, Hiratsuka (JP); Kouji Kakizaki, Hiratsuka (JP); Takanobu Ishihara, Hiratsuka (JP); Tamotsu Abe, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 227 days.

(21) Appl. No.: 13/396,289

(22) Filed: Feb. 14, 2012

(65) Prior Publication Data
US 2012/0217422 A1    Aug. 30, 2012

(30) Foreign Application Priority Data

Feb. 24, 2011 (JP) ................................. 2011-038576
Mar. 22, 2011 (JP) ................................. 2011-063137
Dec. 22, 2011 (JP) ................................. 2011-282189

(51) Int. Cl.
   *H01J 35/20*    (2006.01)
(52) U.S. Cl.
   USPC .................. 250/504 R; 378/119; 250/365
(58) Field of Classification Search
   USPC .................. 250/504 R, 432 R; 378/119
   See application file for complete search history.

(56) References Cited

U.S. PATENT DOCUMENTS

| | | | |
|---|---|---|---|
| 5,991,360 A | 11/1999 | Matsui et al. | |
| 6,377,651 B1 | 4/2002 | Richardson et al. | |
| 6,507,641 B1 * | 1/2003 | Kondo et al. | 378/119 |
| 6,867,843 B2 | 3/2005 | Ogushi et al. | |
| 7,067,832 B2 | 6/2006 | Mizoguchi et al. | |
| 7,122,816 B2 * | 10/2006 | Algots et al. | 250/504 R |
| 7,405,416 B2 * | 7/2008 | Algots et al. | 250/493.1 |
| 7,642,533 B2 * | 1/2010 | Partio et al. | 250/504 R |
| 8,158,960 B2 * | 4/2012 | Vaschenko et al. | 250/504 R |
| 2004/0170252 A1 * | 9/2004 | Richardson | 378/119 |
| 2004/0208286 A1 * | 10/2004 | Richardson | 378/119 |
| 2010/0025223 A1 * | 2/2010 | Yanagida et al. | 204/157.15 |
| 2011/0204249 A1 | 8/2011 | Nagai et al. | |
| 2011/0284774 A1 * | 11/2011 | Ishihara et al. | 250/504 R |
| 2011/0310365 A1 * | 12/2011 | Yabu et al. | 355/30 |
| 2012/0085922 A1 * | 4/2012 | Yabu et al. | 250/432 R |
| 2012/0104289 A1 * | 5/2012 | Mizoguchi et al. | 250/504 R |
| 2012/0241650 A1 * | 9/2012 | Yabu et al. | 250/504 R |
| 2013/0134326 A1 * | 5/2013 | Yabu et al. | 250/455.11 |
| 2013/0186976 A1 * | 7/2013 | Ishihara et al. | 239/102.1 |
| 2013/0277452 A1 * | 10/2013 | Yabu et al. | 239/102.1 |

* cited by examiner

*Primary Examiner* — Nikita Wells
*Assistant Examiner* — Johnnie L Smith
(74) *Attorney, Agent, or Firm* — McDermott Will & Emery LLP

(57) ABSTRACT

An apparatus, configured to generate extreme ultraviolet light by irradiating a target material by a laser beam from a laser apparatus to turn the target material into plasma, includes a chamber with an inlet for introducing the laser beam into the chamber, the chamber including an electrically conductive structural member; and a target generator including an electrode having a first through-hole through which a charged target passes, an electrical insulator for holding the electrode, and a shielding member having a second through-hole, through which the charged target passes, the shielding member being positioned between a plasma generation region and at least the electrical insulator. The target generator generates the charged target of a liquid target material and output the charged target toward the plasma generation region inside the chamber, and the shielding member has electrically conductive properties and is connected electrically to the electrically conductive structural member of the chamber.

12 Claims, 15 Drawing Sheets

_US 8,698,112 B2_

EXTREME ULTRAVIOLET LIGHT GENERATION APPARATUS

CROSS-REFERENCE TO RELATED APPLICATIONS

The present application claims priority from Japanese Patent Application No. 2011-038576 filed Feb. 24, 2011, Japanese Patent Application No. 2011-063137 filed Mar. 22, 2011, and Japanese Patent Application No. 2011-282189 filed Dec. 22, 2011.

BACKGROUND

1. Technical Field

This disclosure relates to an extreme ultraviolet (EUV) light generation apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

An apparatus according to one aspect of the present disclosure may be configured to generate extreme ultraviolet light by irradiating a target material by a laser beam from a laser apparatus to turn the target material into plasma, and may include: a chamber with an inlet for introducing the laser beam into the chamber, the chamber including an electrically conductive structural member; and a target generator including an electrode having a first through-hole formed therein, through which a charged target passes, an electrical insulator for holding the electrode, and a shielding member having a second through-hole formed therein, through which the charged target passes, the shielding member being positioned between a plasma generation region and at least the electrical insulator, wherein the target generator is configured to generate the charged target of a liquid target material and output the charged target toward the plasma generation region inside the chamber, and the shielding member has electrically conductive properties and is connected electrically to the electrically conductive structural member of the chamber.

An apparatus according to another aspect of the present disclosure may be configured to generate extreme ultraviolet light by irradiating a target material by a laser beam from a laser apparatus to turn the target material into plasma, and may include: a chamber with an inlet for introducing the laser beam into the chamber, the chamber including an electrically conductive structural member; a target generator including an electrode having a first through-hole formed therein, through which a charged target passes, an electrical insulator for holding the electrode, and a shielding member having a second through-hole formed therein, through which the charged target passes, the shielding member being positioned between a plasma generation region and at least the electrical insulator, wherein the target generator is configured to generate the charged target of a liquid target material and output the charged target toward the plasma generation region inside the chamber, and the shielding member has electrically conductive properties and is connected electrically to the electrically conductive structural member of the chamber; and a power source configured to apply a reference potential to the electrically conductive structural member of the chamber and to the liquid target material, and apply one of positive and negative potentials to the electrode.

BRIEF DESCRIPTION OF THE DRAWINGS

Hereinafter, selected embodiments of the present disclosure will be described with reference to the accompanying drawings.

Figure 1:
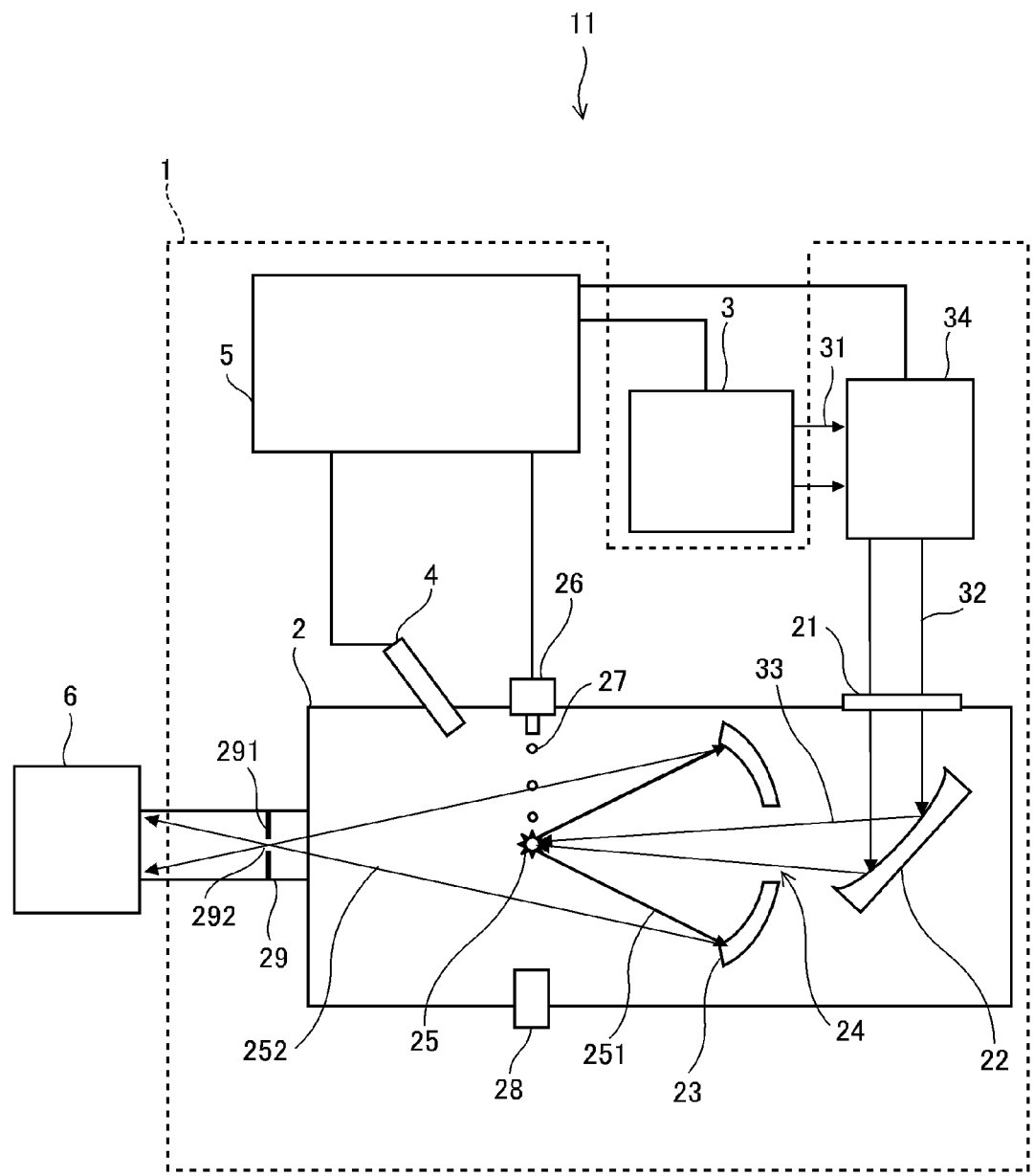
FIG. 1 schematically illustrates the configuration of an exemplary LPP type EUV light generation system.

DESCRIPTION OF PREFERRED
EMBODIMENTS

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents
1. Overview
2. Terms
3. Overview of EUV Light Generation System
    3.1 Configuration
    3.2 Operation
4. Chamber Including Electrostatic-Pull-Out Type Target Generator
    4.1 Configuration
    4.2 Operation
5. Electrostatic-Pull-Out Type Target Generator
    5.1 Configuration
    5.2 Operation
    5.3 Effect
6. Second Embodiment of Target Generator
    6.1 Configuration
    6.2 Operation
    6.3 Effect
7. Operation of Pulse Voltage Generator
8. Third Embodiment of Target Generator
    8.1 Configuration
    8.2 Operation
9. Structure of Electrical Insulator
10. Target Generator Enclosed in Shielding Container
    10.1 Configuration
    10.2 Operation
    10.3 Effect
11. Embodiment Where Members around Target Trajectory Are Connected to Reference Potential
12. Embodiment Where Electrode Is Provided in Target Collector
13. Embodiment Where Heating Unit Is Provided to Shielding Member
14. Continuous-Jet Type Target Generator
    14.1 Configuration
    14.2 Operation
    14.3 Effect
15. Supplementary Descriptions
    15.1 Detecting Charged Target Using Magnetic Circuit
    15.2 Controlling Direction of Target Using Deflection Electrodes 1. Overview An LPP type EUV light generation apparatus used as a light source for an exposure apparatus may be required to generate stable EUV light at a given position. The position at which the EUV light is generated may be determined by a position at which a target is irradiated by a laser beam. Accordingly, the positional stability of targets supplied from a target generator may serve as an important factor in generating stable EUV light in a given position. One way to control the position to which a target is supplied in a chamber is to charge a target and control the trajectory of the charged target with an electric field or a magnetic field.

However, when a target is irradiated by a laser beam and the target is turned into plasma, debris including charged particles (ions and electrons) of a target material, which forms the targets, may scatter from the plasma. Accordingly, the charged particles may adhere to electrically non-conductive structural elements provided inside the chamber, which in turn may cause the structural elements to become charged. As a result, the potential distribution (electric field) along the trajectory of the charged targets may fluctuate, and the direction into which the charged targets travel may fluctuate as well. In some of the embodiments of the present disclosure, an electrically conductive shielding member may be provided for shielding electrically non-conductive members of a target generator from charged particles, and the electrically conductive shielding member may be connected electrically to an electrically conductive member of a chamber. With this configuration, fluctuations in the potential distribution along the trajectory of the charged targets may be reduced, which may result in the improvement in the positional stability of the charged targets traveling inside the chamber.

2. Terms

Terms used in this application may be interpreted as follows. A "chamber" may be a container for isolating a space in which plasma is to be generated in an LPP type EUV light generation apparatus. A "target generator" may be a device for outputting targets used to generate the EUV light into the chamber. Targets may be in the form of droplets. An "EUV collector mirror" may be an optical element for selectively reflecting EUV light emitted from the plasma so as to output the EUV light outside the chamber. "Debris" may include neutral particles of a target material supplied into the chamber which was not turned into plasma, and ions emitted from the plasma. The debris may cause contamination or damage to optical elements, such as the EUV collector mirror, provided in the chamber.

3. Overview of EUV Light Generation System 3.1 Configuration

FIG. 1 schematically illustrates the configuration of an exemplary LPP type EUV light generation system. An LPP type EUV light generation apparatus 1 may be used with at least one laser apparatus 3. In this application, a system including the EUV light generation apparatus 1 and the laser apparatus 3 may be referred to as an EUV light generation system 11. As illustrated in FIG. 1 and described in detail below, the EUV light generation apparatus 1 may include a chamber 2, a target supply unit (target generator 26, for example), and so forth. The chamber 2 may be airtightly sealed. The target supply unit may be mounted to the chamber 2 so as to penetrate a wall of the chamber 2, for example. A target material to be supplied by the target supply unit may include, but is not limited to, tin, terbium, gadolinium, lithium, xenon, or any combination thereof.

The chamber 2 may have at least one through-hole formed in its wall. The through-hole may be covered with a window 21, and a pulsed laser beam 32 may pass through the window 21 into the chamber 2. An EUV collector mirror 23 having a spheroidal surface may, for example, be disposed inside the chamber 2. The EUV collector mirror 23 may have a multi-layered reflective film formed on the spheroidal surface, and the reflective film may include molybdenum and silicon which are, for example, laminated in alternate layers. The EUV collector mirror 23 may have first and second foci. The EUV collector mirror 23 may preferably be positioned such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and a pulsed laser beam 33 may travel through the through-hole 24.

The EUV light generation system 11 may include an EUV light generation controller 5, a target sensor 4, and so forth. The target sensor 4 may be equipped with an imaging function and may be configured to detect at least one of the presence, trajectory, and position of a target.

Further, the EUV light generation apparatus 1 may include a connection part 29 for allowing the interior of the chamber 2 and the interior of the exposure apparatus 6 to be in communication with each other. A wall 291 having an aperture may be disposed inside the connection part 29 such that the second focus of the EUV collector mirror 23 lies in the aperture formed in the wall 291.

Further, the EUV light generation system 11 may include a laser beam direction control unit 34, a laser beam focusing mirror 22, and a target collector 28 for collecting targets 27. The laser beam direction control unit 34 may include an optical element for defining the direction into which the laser beam travels and an actuator for adjusting the position and the orientation (posture) of the optical element.

3.2 Operation

With reference to FIG. 1, a pulsed laser beam 31 outputted from the laser apparatus 3 may pass through the laser beam direction control unit 34, and may be outputted from the laser beam direction control unit 34 as a pulsed laser beam 32 after having its direction optionally adjusted. The pulsed laser beam 32 may travel through the window 21 and enter the chamber 2. The pulsed laser beam 32 may travel inside the chamber 2 along at least one beam path from the laser apparatus 3, be reflected by the laser beam focusing mirror 22, and strike at least one target 27, as a pulsed laser beam 33.

The target generator 26 may output targets 27 toward a plasma generation region 25 inside the chamber 2. Each of the targets 27 may be irradiated by at least one pulse included in the pulsed laser beam 33. The target 27, which has been irradiated by the pulsed laser beam 33, may be turned into plasma, and rays of light including EUV light 251 may be emitted from the plasma. The EUV light 251 may be reflected selectively by the EUV collector mirror 23 as EUV light 252. The EUV light 252 may travel through the intermediate focus region 292 and be outputted to the exposure apparatus 6. It is to be noted that a target 27 may be irradiated by multiple pulses included in the pulsed laser beam 33.

The EUV light generation controller 5 may integrally control the EUV light generation system 11. The EUV light generation controller 5 may process image data or the like of a target 27 captured by the target sensor 4. Further, the EUV light generation controller 5 may control at least one of the timing at which the target 27 is outputted from the target generator 26 and the direction into which the target 27 is outputted from the target generator 26. Furthermore, the EUV light generation controller 5 may control at least one of the timing at which the laser apparatus 3 oscillates (e.g., by controlling the laser apparatus 3), the direction into which the pulsed laser beam 32 travels (e.g., by controlling the laser beam direction control unit 34), and the position at which the pulsed laser beam 33 is focused (e.g., by controlling laser apparatus 3, the laser beam direction control unit 34, the laser beam focusing mirror 22, and so forth). The various controls mentioned above are merely examples, and other controls may be added as necessary.

Figure 2:
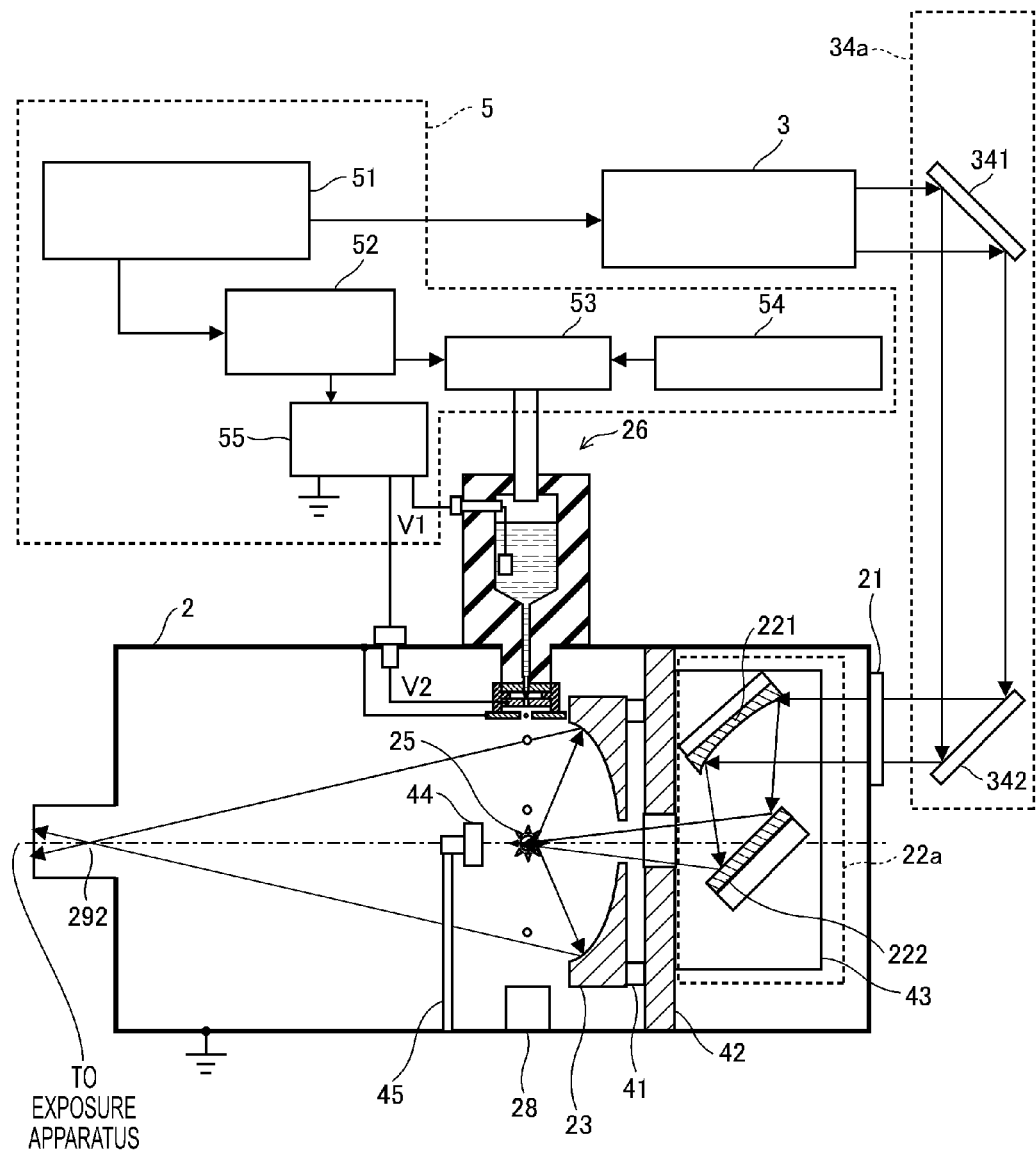
FIG. 2 illustrates the configuration of an EUV light generation apparatus according to a first embodiment, in which a target generator and chamber portion of the apparatus is detailed.

4. Chamber Including Electrostatic-Pull-Out Type Target Generator 4.1 Configuration FIG. 2 illustrates the configuration of an EUV light generation apparatus according to a first embodiment, in which a part of the apparatus is shown in section. As illustrated in FIG. 2, a laser beam focusing optical system 22a, the EUV collector mirror 23, the target collector 28, an EUV collector mirror mount 41, plates 42 and 43, a beam dump 44, a beam dump support member 45 may be provided inside the chamber 2.

The chamber 2 may include an electrically conductive structural member formed of a highly electrically conductive material (such as metal). The chamber 2 may further include an electrically non-conductive structural member. The wall of the chamber 2 may, for example, be formed of the electrically conductive structural member and the electrically non-conductive structural members may be arranged inside the chamber.

The plate 42 may be attached to the chamber 2, and the plate 43 may be attached to the plate 42. The EUV collector mirror 23 may be attached to the plate 42 through the EUV collector mirror mount 41.

The laser beam focusing optical system 22a may include an off-axis paraboloidal mirror 221 and a flat mirror 222, and these mirrors may be provided with respective mounts. The off-axis paraboloidal mirror 221 and the flat mirror 222 may be attached to the plate 43 through the respective mounts. The position and the orientation of the off-axis paraboloidal mirror 221 and the flat mirror 222 may be adjusted such that a laser beam reflected by these mirrors may be focused in the plasma generation region 25. The beam dump 44 may be attached to the chamber 2 through the beam dump support member 45 so as to be positioned on a beam path of a laser beam which has passed through the plasma generation region 25. The target collector 28 may be disposed in the chamber 2 in the direction into which targets 27 may travel after having passed through the plasma generation region 25.

The chamber 2 may include the target generator 26 of an electrostatic-pull-out type. Details of the target generator 26 will be given later. Electrically conductive metal or the like may be used as the target material. In the embodiments disclosed in this application, tin (Sn), whose melting point is 232 degrees Celsius, may be used as the target material.

A beam delivery unit 34a and the EUV light generation controller 5 may be provided outside the chamber 2. The beam delivery unit 34a may include high-reflection mirrors 341 and 342, and these mirrors may be provided with respective mounts (not shown). The high-reflection mirrors 341 and 342 and the mounts may be disposed in a housing (not shown). The EUV light generation controller 5 may include an EUV light generation control device 51, a target control device 52, a pressure adjuster 53, an inert gas cylinder 54 and a pulse voltage generator 55.

4.2 Operation

The target generator 26 may be configured to generate charged targets 27 and output the charged targets 27 toward the plasma generation region 25. The laser beam from the laser apparatus 3 may be reflected by the high-reflection mirrors 341 and 342, pass through the window 21, and enter the laser beam focusing optical system 22a. The laser beam that has entered the laser beam focusing optical system 22a may be reflected by the off-axis paraboloidal mirror 221 and the flat mirror 222 and be focused in the plasma generation region 25.

The EUV light generation control device 51 may be configured to output a target generation signal to the target control device 52 and a laser beam output signal to the laser apparatus 3. With this, a target 27 outputted from the target generator 26 may be irradiated by a laser beam from the laser apparatus 3 when the target 27 arrives in the plasma generation region 25. The target 27, having been irradiated by the laser beam, may be turned into plasma, and the EUV light may be emitted from the plasma. The emitted EUV light may be reflected by the EUV collector mirror 23 so as to be focused in the intermediate focus region 292 and outputted to the exposure apparatus. Here, the laser beam outputted from the laser apparatus 3 may be a pulsed laser beam.

5. Electrostatic-Pull-Out Type Target Generator

5.1 Configuration

Figure 3A:
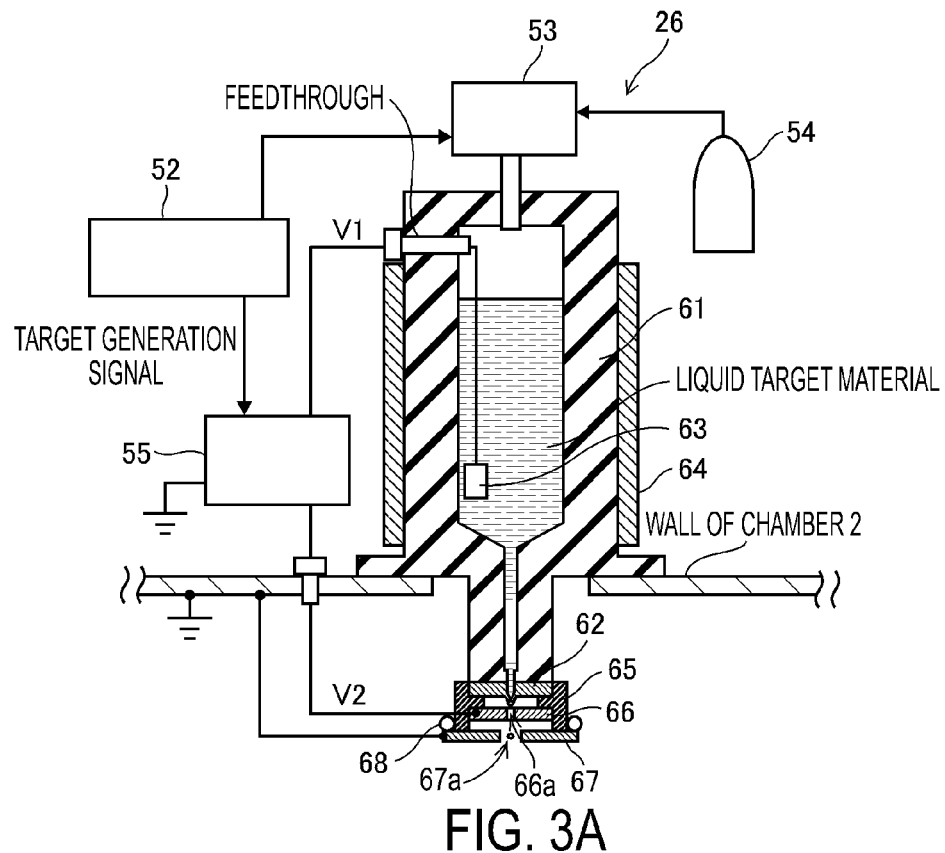
FIG. 3A is a sectional view illustrating a target generator shown in FIG. 2 and peripheral components of the target generator.
Figure 3B:
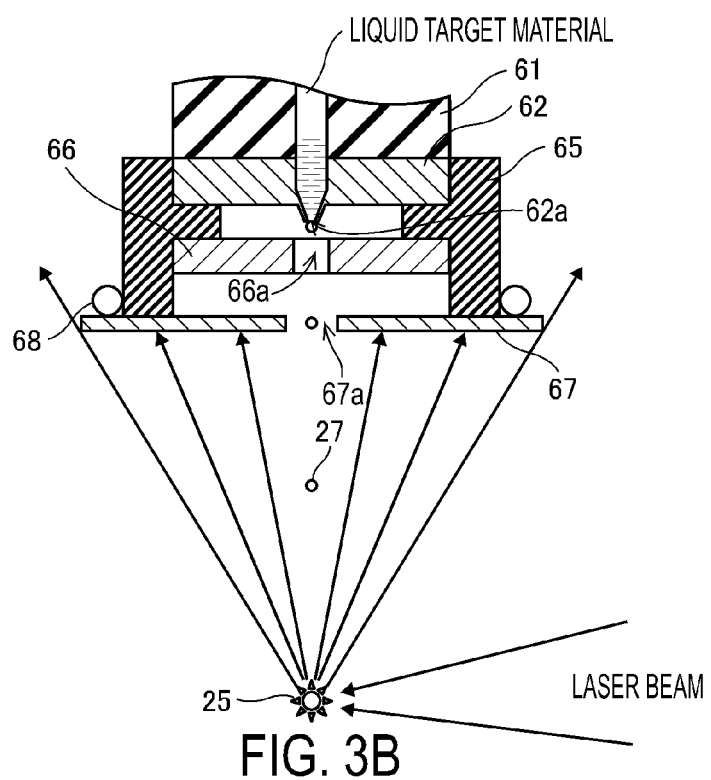
FIG. 3B is an enlarged sectional view illustrating a part of the target generator shown in FIG. 3A.

FIG. 3A is a sectional view illustrating a target generator shown in FIG. 2 and peripheral components of the target generator; and FIG. 3B is an enlarged sectional view illustrating a part of the target generator shown in FIG. 3A. As illustrated in FIG. 3A, the target generator 26 may include a reservoir (target storage unit) 61, a nozzle (target discharge unit) 62, an electrode 63, a heater 64, an electrical insulator 65, a pull-out electrode 66, and a shielding plate 67. The reservoir 61 and the nozzle 62 may be formed integrally or separately.

The reservoir 61 may be formed of an electrically non-conductive material, such as synthetic quartz, alumina, or the like. The reservoir 61 may be configured to store tin in a molten state (liquid target material) and supply the molten tin into the nozzle 62. The heater 64 may be provided around the reservoir 61 so as to heat the reservoir 61 such that tin inside the reservoir 61 is kept in a molten state. The heater 64 may be used with a temperature sensor (not shown) for detecting the temperature of the reservoir 61, a heater power source for supplying current to the heater 64, and a temperature controller for controlling the heater power source based on the temperature detected by the temperature sensor.

The nozzle 62 may be oriented such that the liquid target material inside the reservoir 61 is outputted as targets 27 toward the plasma generation region 25 through the nozzle 62. As illustrated in FIG. 3B, an opening 62a (orifice) may be formed in the nozzle 62, and the liquid target material stored in the reservoir 61 may be discharged through the opening 62a. The nozzle 62 may have a tip portion projecting from a bottom surface for enhancing an electric field at the liquid target material in the tip portion of the nozzle 62.

The electrical insulator 65 for holding the pull-out electrode 66 and the shielding plate 67 may be attached to the nozzle 62. The electrical insulator 65 may provide electrical insulation between the nozzle 62 and the pull-out electrode 66 and between the pull-out electrode 66 and the shielding plate 67. The pull-out electrode 66 may be disposed so as to face the bottom surface of the nozzle 62. The electrical insulator 65, the pull-out electrode 66, and the shielding plate 67 may each have a through-hole formed therein. For example, the pull-out electrode 66 may have a through-hole 66a and the shielding plate 67 may have a through-hole 67a, through which charged targets 27 may travel toward the plasma generation region 25.

When necessary, the pressure adjuster 53 may allow an inert gas in the inert gas cylinder 54 to flow into the reservoir 61 so as to push out the liquid target material toward the tip of the nozzle 62. The target control device 52 may be configured to control the pulse voltage generator 55 and optionally the pressure adjuster 53 such that targets 27 are generated at the timings specified by the EUV light generation controller 51 (see FIG. 2).

Wiring, connected at one end to one output terminal of the pulse voltage generator 55, may be connected at the other end to the electrode 63, which is in contact with the liquid target material, through an airtight terminal (feedthrough) provided on the reservoir 61. Wiring, connected at one end to the other output terminal of the pulse voltage generator 55, may be connected at the other end to the pull-out electrode 66. The pulse voltage generator 55 may be configured to generate voltage signals for pulling out the liquid target material to generate the targets 27 under the control of the target control device 52. For example, a voltage signal V1 to be applied to the liquid target material and a voltage signal V2 to be applied to the pull-out electrode 66 may be generated.

For example, the pulse voltage generator 55 may generate a voltage signal that changes in pulses between the reference potential (0 V) and a potential P1, where the potential P1 is higher than the reference potential. In this case, the generated voltage signal may be applied to the liquid target material through the electrode 63, and the reference potential may be applied to the pull-out electrode 66.

Alternatively, the pulse voltage generator 55 may generate a voltage signal that changes in pulses between potentials P1 and P2, where the potential P1 is higher than the reference potential and the potential P2 is higher than the potential P1. In this case, the generated voltage signal may be applied to the liquid target material through the electrode 63, and the potential P1 may be applied to the pull-out electrode 66.

The potential of the liquid target material may change in accordance with the voltage signal V1. The potential of the pull-out electrode 66 may be retained constant in accordance with the voltage signal V2. With this, a voltage (V2−V1) may be applied between the liquid target material and the pull-out electrode 66. Alternatively, when the reservoir 61 or the nozzle 62 is formed of an electrically conductive material, the pulse voltage generator 55 may apply the voltage (V2−V1) between the pull-out electrode 66 and the reservoir 61 or the nozzle 62.

The shielding plate 67 may be positioned so as to cover at least a portion of the electrical insulator 65 which faces the plasma generation region 25. The shielding plate 67 may shield electrical insulators, such as the electrical insulator 65, from charged particles emitted from plasma generated in the plasma generation region 25.

The shielding plate 67 may be formed of an electrically conductive material (such as metal). The shielding plate 67 may be connected electrically to an electrically conductive structural member (such as the wall) of the chamber 2 through an electrically conductive connecting member, such as a wire. The electrically conductive structural member of the chamber 2 may be connected electrically to the reference potential of the pulse voltage generator 55, and may further be grounded as well. Piping 68 may be provided on the shielding plate 67 for allowing a heat carrier to circulate in the piping 68 for cooling the shielding plate 67. The piping 68 may be connected to a chiller (not shown), and the heat carrier cooled by the chiller may circulate in the piping 68.

5.2 Operation

The target generator 26 may be a device for generating targets 27 on-demand. Targets 27 may be in the form of droplets. The reservoir 61 may be heated by the heater 64 to a temperature at or above 232 degrees Celsius. With this, tin stored inside the reservoir 61 may be retained in a molten state (liquid target material).

The target control device 52 may be configured to output target generation signals to the pulse voltage generator 55. In accordance with the target generation signals, the pulse voltage generator 55 may apply a voltage between the liquid target material and the pull-out electrode 66. With this, the electrostatic force may be generated between the liquid target material and the pull-out electrode 66, whereby the liquid target material may be pulled out through the orifice 62a in the nozzle 62, and charged targets may be generated. In synchronization with the timing at which a charged target 27 arrives in the plasma generation region 25, the charged target 27 may be irradiated by the laser beam. With this, the target 27 may be turned into plasma, and the EUV light may be emitted from the plasma. At the same time, charged particles including ions and electrons may be generated, and a portion of the charged particles may reach the shielding plate 67.

5.3 Effect

According to the first embodiment, the charged particles, such as ions and electrons, emitted in the plasma generation region 25 may be prevented from reaching electrical insulators, such as the electrical insulator 65, in the chamber 2 by the shielding plate 67 provided on the target generator 26. This in turn may prevent the electrical insulators, such as the electrical insulator 65, in the chamber 2 from becoming charged by the charged particles. Further, since the shielding plate 67 may be connected to the reference potential, even when the charged particles reach the shielding plate 67, the shielding plate 67 may not become charged by the charged particles. Accordingly, fluctuations in the potential distribution (electric field) along the trajectory of the charged targets may be reduced, which may result in the improvement in the positional stability of the charged targets traveling inside the chamber 2.

6. Second Embodiment of Target Generator

6.1 Configuration

Figure 4:
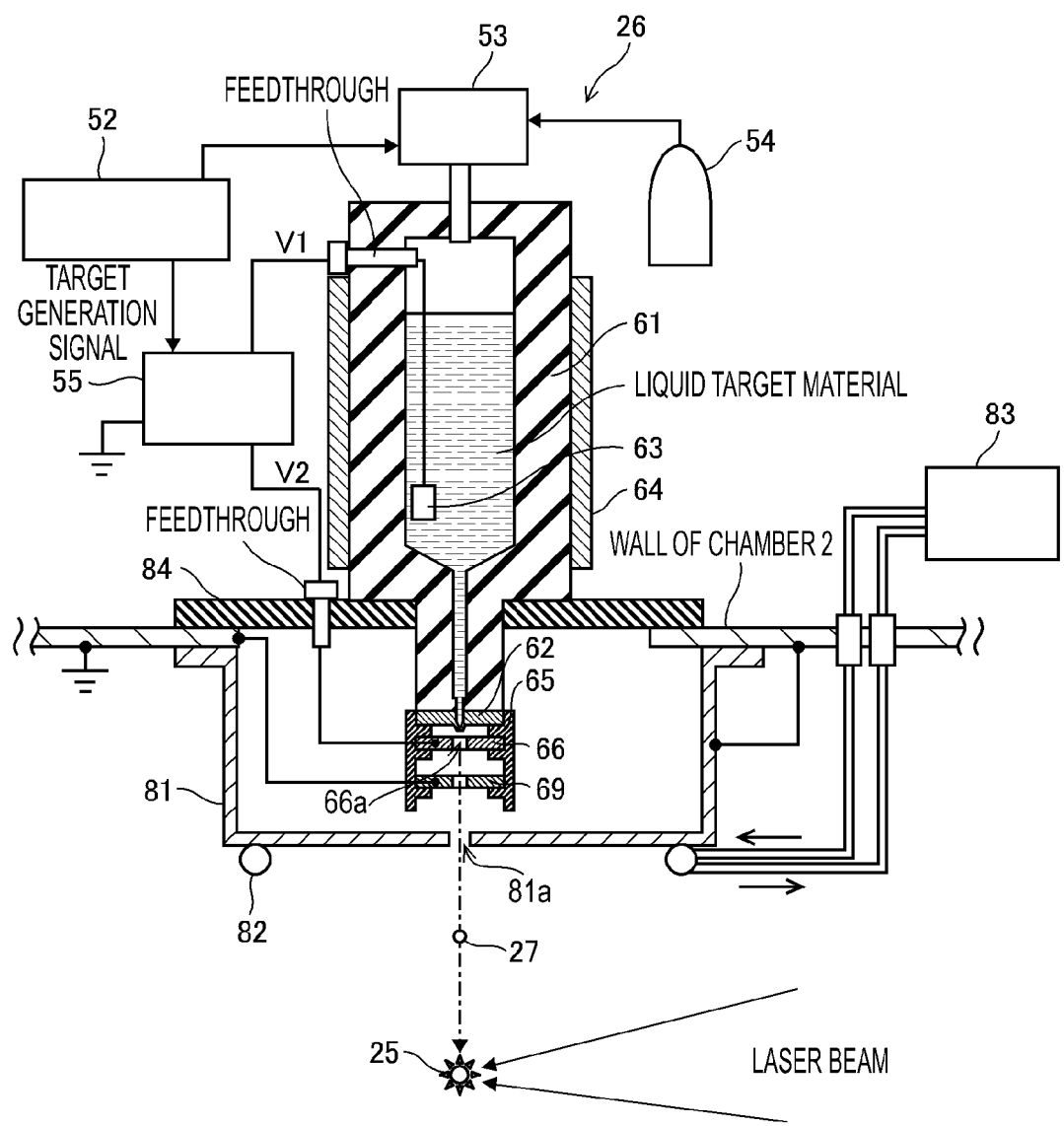
FIG. 4 is a sectional view illustrating a part of a target generator and peripheral components of the target generator included in an EUV light generation apparatus according to a second embodiment.

FIG. 4 is a sectional view illustrating a part of a target generator and peripheral components of the target generator included in an EUV light generation system according to a second embodiment. The second embodiment shown in FIG. 4 may differ from the first embodiment shown in FIGS. 3A and 3B in the following points. The target generator 26 according to the second embodiment may not be provided with the shielding plate 67. An acceleration electrode 69 may be added to the target generator 26, and the acceleration electrode 69 may have a through-hole formed therein, through which targets 27 may travel toward the plasma generation region 25. The acceleration electrode 69 may be connected to an electrically conductive structural member of the chamber 2 or to the reference potential of the pulse voltage generator 55 through an electrically conductive connecting member, such as a wire.

Further, a shielding cover 81 may be added to the chamber 2. The shielding cover 81 may be attached to the inner surface of the wall of the chamber 2. The shielding cover 81 may be arranged so as to shield at least the electrical insulator 65 from the plasma generation region 25. The shielding cover 81 may have a through-hole 81a formed therein, through which targets 27 may travel toward the plasma generation region 25. The shielding cover 81 may shield electrical insulators, such as the electrical insulator 65, inside the chamber 2 from charged particles emitted from plasma generated in the plasma generation region 25.

The shielding cover 81 may be formed of an electrically conductive material (such as metal). The shielding cover 81 may be connected electrically to an electrically conductive structural member (such as the wall) of the chamber 2 either directly or through an electrically conductive connecting member, such as a wire. The electrically conductive structural member of the chamber 2 may be connected electrically to the reference potential of the pulse voltage generator 55, and may further be grounded as well. The shielding cover 81 may be positioned in the chamber 2 so as to cover at least the reservoir 61, the nozzle 62, the electrical insulator 65, and the pull-out electrode 66, and preferably the acceleration electrode 69. Piping 82 may be provided on the shielding cover 81 for allowing a heat carrier to circulate in the piping 82 for cooling the shielding cover 81. The piping 82 may be connected to a chiller 83, and the heat carrier cooled by the chiller 83 may circulate in the piping 82.

The reservoir 61 may be mounted onto the chamber 2 through a flange 84 having electrically non-conductive properties. In this case, the reservoir 61 may be formed of an electrically conductive material, such as molybdenum (Mo).

6.2 Operation

The charged target that has been pulled out by the electrostatic force generated between the liquid target material and the pull-out electrode 66 may be accelerated as the reference potential is applied to the acceleration electrode 69. As shown in FIG. 4, the accelerated target 27 may travel through the through-hole formed in the acceleration electrode 69 and through the through-hole 81a formed in the shielding cover 81 toward the plasma generation region 25.

6.3 Effect

According to the second embodiment, the charged particles, such as ions and electrons, emitted in the plasma generation region 25 may be prevented from reaching electrical insulators, such as the electrical insulator 65, in the chamber 2 by the shielding cover 81 provided in the chamber 2. Since the shielding cover 81 is connected to the reference potential, fluctuations in the potential distribution (electric field) along the trajectory of the charged targets may be reduced, which may result in the improvement in the positional stability of the charged targets traveling inside the chamber 2.

The shielding cover 81 may cover primary constituent elements of the target generator 26 in the chamber 2, and thus electrically non-conductive members arranged around the primary constituent elements may be shielded from the charged particles as well. Unlike the shielding plate 67 according to the first embodiment, the shielding cover 81 may be effective for preventing the charged particles which approach the target generator 26 from the side from reaching the electrical insulator 65 provided on the target generator 26. As a result, compared to the first embodiment, fluctuations in the potential distribution along the trajectory of the charged targets may be reduced more effectively.

7. Operation of Pulse Voltage Generator

Figure 5:
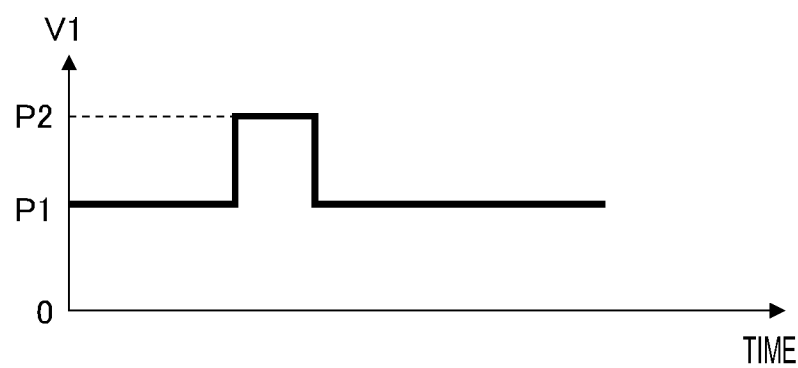
FIG. 5 is a timing chart showing the operation of a pulse voltage generator in the EUV light generation apparatus of the first or second embodiment.
Figure 5:
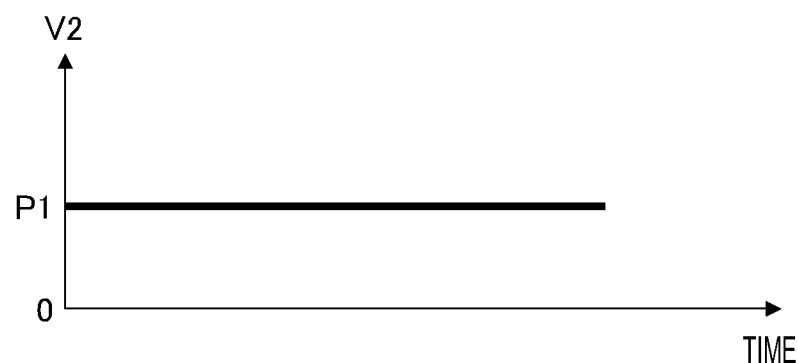

FIG. 5 is a timing chart showing the operation of the pulse voltage generator in the EUV light generation apparatus of the first or second embodiment. With reference to FIGS. 4 and 5, the pulse voltage generator 55 may be configured to generate a voltage signal V1 to be applied to the liquid target material, a voltage signal V2 to be applied to the pull-out electrode 66, and a voltage signal to be applied to the acceleration electrode 69, when provided, as follows.

The pulse voltage generator 55 may retain the voltage signal V2 at the potential P1 (for example, 10 kV), which is higher than the reference potential. In the initial state, the pulse voltage generator 55 may retain the voltage signal V1 at the potential P1. When the liquid target material is to be pulled out, the pulse voltage generator 55 may raise the voltage signal V1 to the potential P2 (for example, 20 kV). Here, a voltage (P2−P1) may be at or above the threshold for pulling out the liquid target material. With this, a voltage (V1−V2) between the liquid target material and the pull-out electrode 66 may be in a value that is at or above the threshold, and a target having been pulled out through the nozzle 62 may become positively charged.

After the charged target passes through the through-hole 66a formed in the pull-out electrode 66, the pulse voltage generator 55 may lower the voltage signal V1 back to the potential P1. The voltage signal applied to the acceleration electrode 69 may be retained at the reference potential, which is the same as the potential of the chamber 2; thus, the charged target may be accelerated as it travels toward the through-hole formed in the acceleration electrode 69. Here, the potentials P1 and P2 may satisfy the following relationship.

$$0(\text{potential of chamber}) < P1 < P2$$

In the above example, the target may be charged positively; however, the present disclosure is not limited thereto, and the target may be charged negatively. If this is the case, the potentials P1 and P2 may satisfy the following relationship.

$$P1 < P2 < 0(\text{potential of chamber})$$

However, in the case where the tip of the nozzle 62 is projecting from the bottom surface, when a target is to be charged negatively, an electric discharge may be more likely to occur between the tip of the nozzle 62 and the pull-out electrode 66. Accordingly, it is more preferable that the targets be charged positively.

8. Third Embodiment of Target Generator

8.1 Configuration

Figure 6:
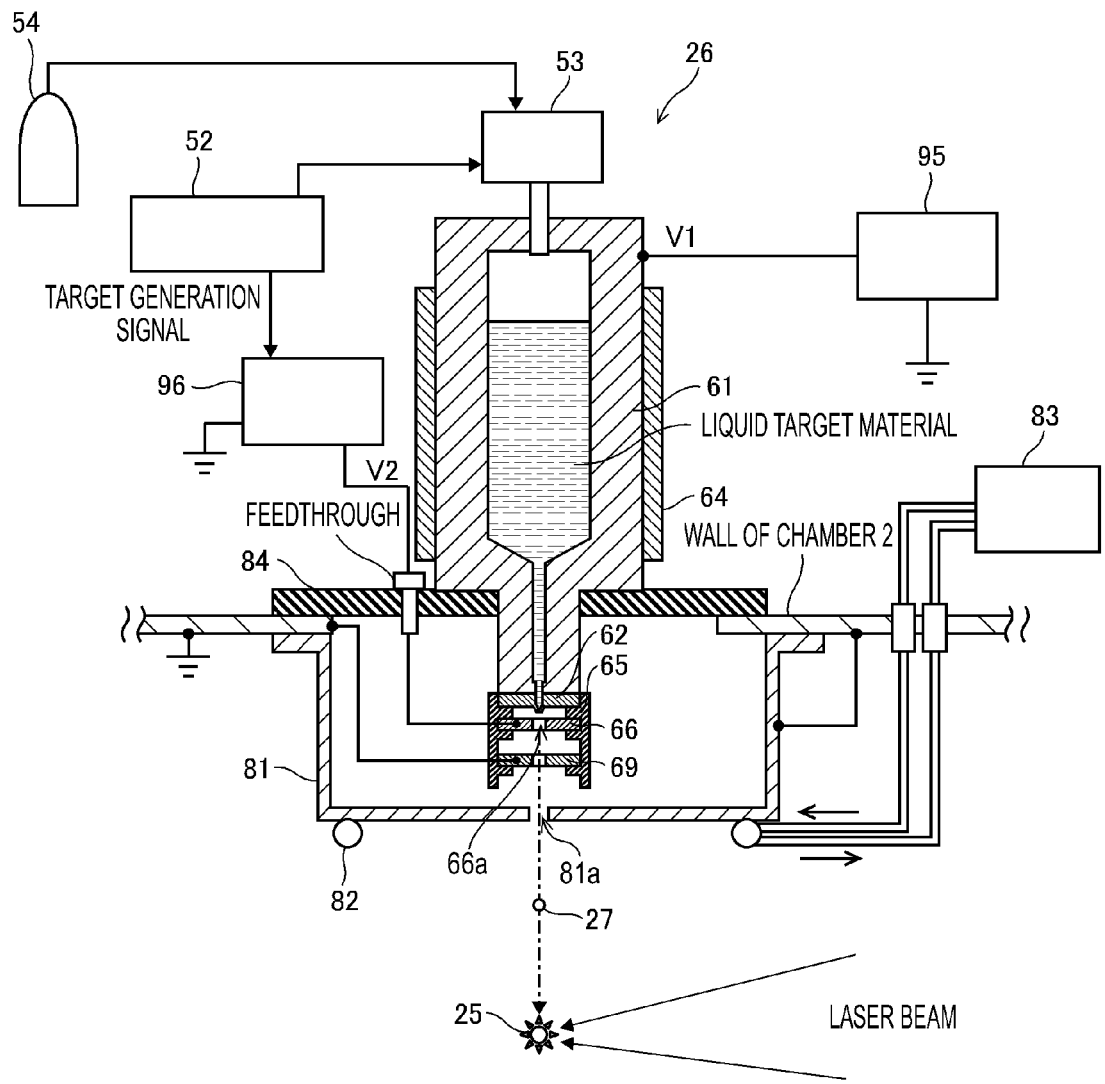
FIG. 6 is a sectional view illustrating a part of a target generator and peripheral components of the target generator included in an EUV light generation apparatus according to a third embodiment.

FIG. 6 is a sectional view illustrating a part of a target generator and peripheral components of the target generator included in an EUV light generation apparatus according to a third embodiment. The third embodiment shown in FIG. 6 may differ from the second embodiment shown in FIG. 4 in the following points. The liquid target material may be retained at a constant potential, and the potential of the pull-out electrode 66 may be changed in pulses. Thus, in the third embodiment, a DC power source 95 for applying a DC potential to the liquid target material and a pulse voltage generator 96 for applying a voltage signal to the pull-out electrode 66 may be provided.

The reservoir 61 may be formed of an electrically conductive metal material, such as molybdenum (Mo), and may be mounted onto the chamber 2 through the flange 84 having electrically non-conductive properties. The DC power source 95 may apply the DC potential to the liquid target material through the reservoir 61. The acceleration electrode 69 may be connected to the reference potential through an electrically conductive connecting member, such as a wire.

8.2 Operation

Figure 7:
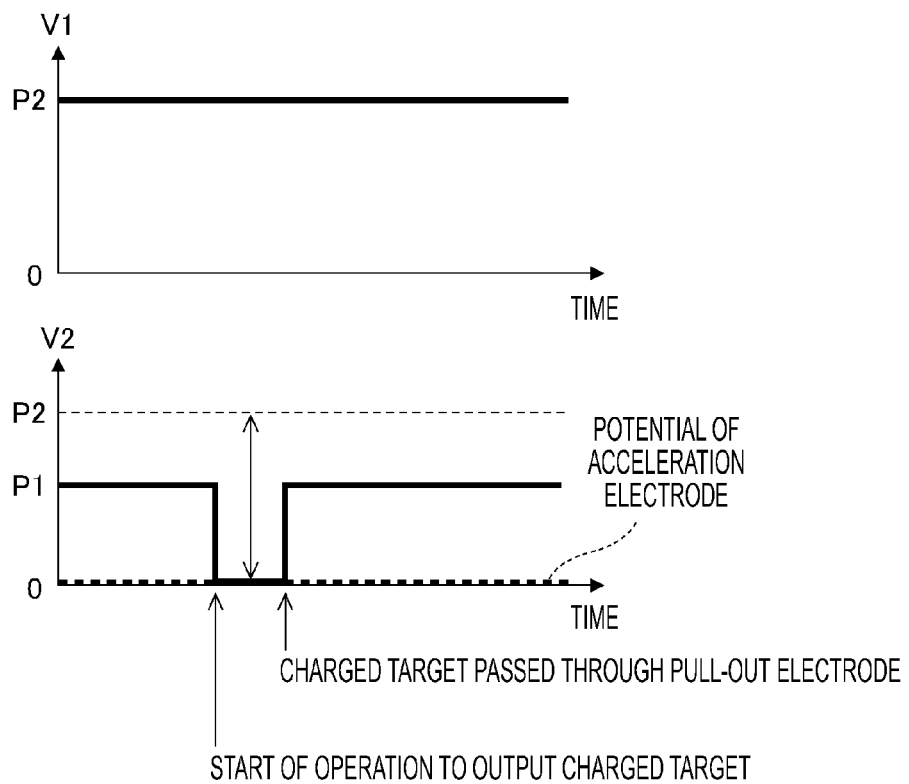
FIG. 7 is a timing chart showing a first example of the operation of the target generator shown in FIG. 6.

FIG. 7 is a timing chart showing a first example of the operation of the target generator shown in FIG. 6. The DC power source 95 and the pulse voltage generator 96 may, for example, be configured to control a voltage signal V1 to be applied to the liquid target material, a voltage signal V2 to be applied to the pull-out electrode 66, and a voltage signal to be applied to the acceleration electrode 69 as follows.

The DC power source 95 may retain the voltage signal V1 at the potential P2 (10 kV, for example), which is higher than the reference potential. In the initial state, the pulse voltage generator 96 may retain the voltage signal V2 at the potential P1, which is higher than the reference potential but lower than the potential P2. When the liquid target material is to be pulled out, the pulse voltage generator 96 may lower the voltage signal V2 to the reference potential. Here, a voltage (P2−P1) may preferably be below the threshold voltage for pulling out the liquid target material, and a voltage (P2−0 V) may preferably be at or above the threshold voltage. With this, the voltage (V1−V2) between the liquid target material and the pull-out electrode 66 may be changed from the voltage (P2−P1) to the voltage (P2−0 V), whereby a target having been pulled out through the nozzle 62 may become positively charged.

After a charged target passes trough the through-hole 66a formed in the pull-out electrode 66, the pulse voltage generator 96 may raise the voltage signal V2 back to the potential P1. The voltage signal to be applied to the acceleration electrode 69 may be retained at the reference potential, which is the same as the potential of the chamber 2. As a result, the charged target may be accelerated.

Figure 8:
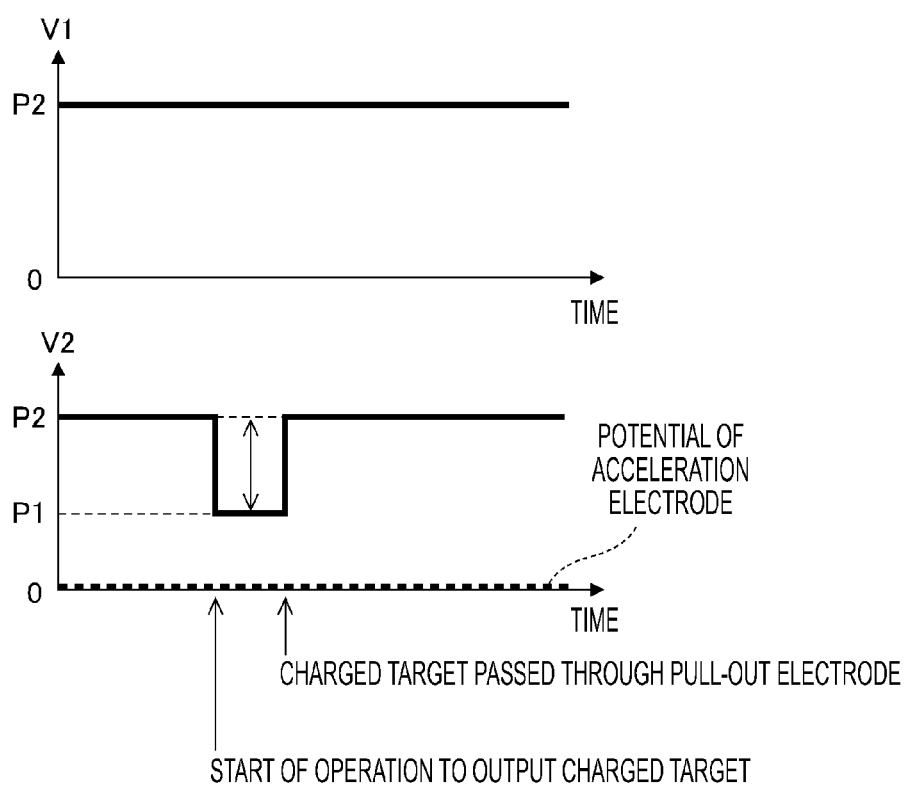
FIG. 8 is a timing chart showing a second example of the operation of the target generator shown in FIG. 6.

FIG. 8 is a timing chart showing a second example of the operation of the target generator shown in FIG. 6. In this example, the DC power source 95 and the pulse voltage generator 96 may, for example, be configured to control a voltage signal V1 to be applied to the liquid target material, a voltage signal V2 to be applied to the pull-out electrode 66, and a voltage signal to be applied to the acceleration electrode 69 as follows.

The DC power source 95 may retain the voltage signal V1 at the potential P2 (10 kV, for example), which is higher than the reference potential. In the initial state, the pulse voltage generator 96 may retain the voltage signal V2 at the potential P2. When the liquid target material is to be pulled out, the pulse voltage generator 96 may lower the voltage signal V2 to the potential P1, which is higher than the reference potential but lower than the potential P2. Here, the voltage (P2−P1) may be at or above the threshold for pulling out the liquid target material. With this, the voltage (V1−V2) between the liquid target material and the pull-out electrode 66 may be changed from a voltage (P2−P2) to a voltage (P2−P1), whereby the liquid target material may be pulled out through the nozzle 62 and the target having been pulled out may become positively charged.

After the charged target passes through the through-hole 66a formed in the pull-out electrode 66, the pulse voltage generator 96 may raise the voltage signal V2 back to the potential P2. The voltage signal to be applied to the acceleration electrode 69 may be retained at the reference potential, which is the same as the potential of the chamber 2. As a result, the charged target may be accelerated.

9. Structure of Electrical Insulator

Figure 9A:
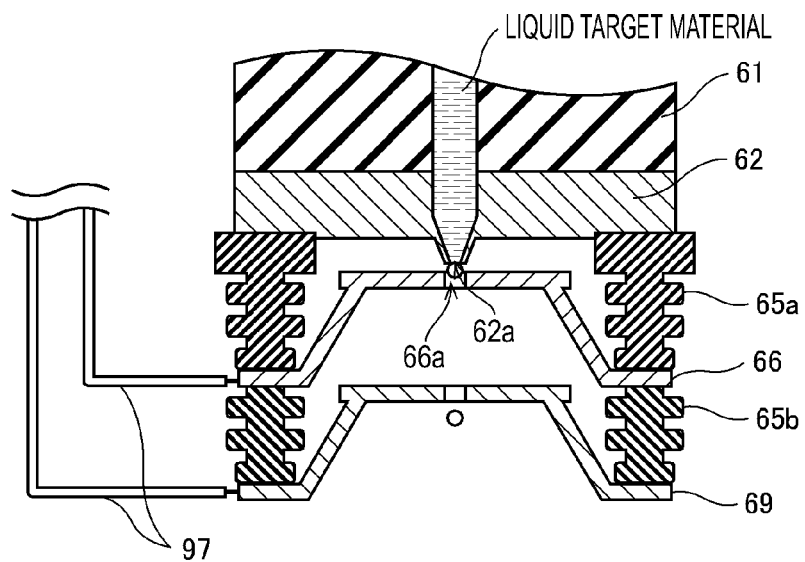
FIG. 9A is a sectional view illustrating a part of a target generator including a corrugated electrical insulator.
Figure 9B:
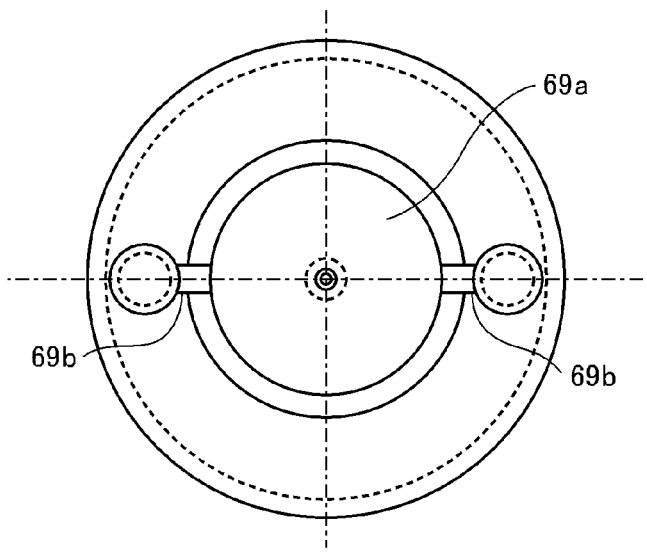
FIG. 9B is a bottom view illustrating a part of the target generator shown in FIG. 9A.
Figure 9C:
FIG. 9C is a sectional view showing variations of the corrugations on the electrical insulator shown in FIG. 9A.

In the above-described embodiments and in the embodiments to be described below, a corrugated electrical insulator may be used. FIG. 9A is a sectional view illustrating a part of a target generator including a corrugated electrical insulator; FIG. 9B is a bottom view illustrating a part of the target generator shown in FIG. 9A; and FIG. 9C is a sectional view showing variations of the corrugations on the electrical insulator shown in FIG. 9A. As illustrated in FIG. 9A, the pull-out electrode 66 may be attached to the nozzle 62 through electrical insulators 65a and the acceleration electrode 69 may be attached to the pull-out electrode 66 through electrical insulators 65b.

The electrical insulators 65a and 65b may be formed of an electrically non-conductive material, such as alumina ceramics, and may have a generally cylindrical shape with a plurality of corrugations formed on side surfaces thereof. With this, dielectric strength voltages between the nozzle 62 and the pull-out electrode 66, and between the pull-out electrode 66 and the acceleration electrode 69 may be increased. The number of corrugations on the respective electrical insulators 65a and 65b may be two or three as shown in FIG. 9C, or may be in any other numbers. Wiring connected to the pull-out electrode 66 and to the acceleration electrode 69, respectively, may be Teflon®-coated wires 97.

As illustrated in FIG. 9B, the acceleration electrode 69 may include an electrode body 69a having the through-hole formed therein, and a plurality of supports (poles) 69b for supporting the electrode body 69a. The electrode body 69a and the supports 69b may each be formed of a metal material, such as molybdenum (Mo). The structure of the pull-out electrode 66 may be similar to that of the acceleration electrode 69.

10. Target Generator Enclosed in Shielding Container

10.1 Configuration

Figure 10:
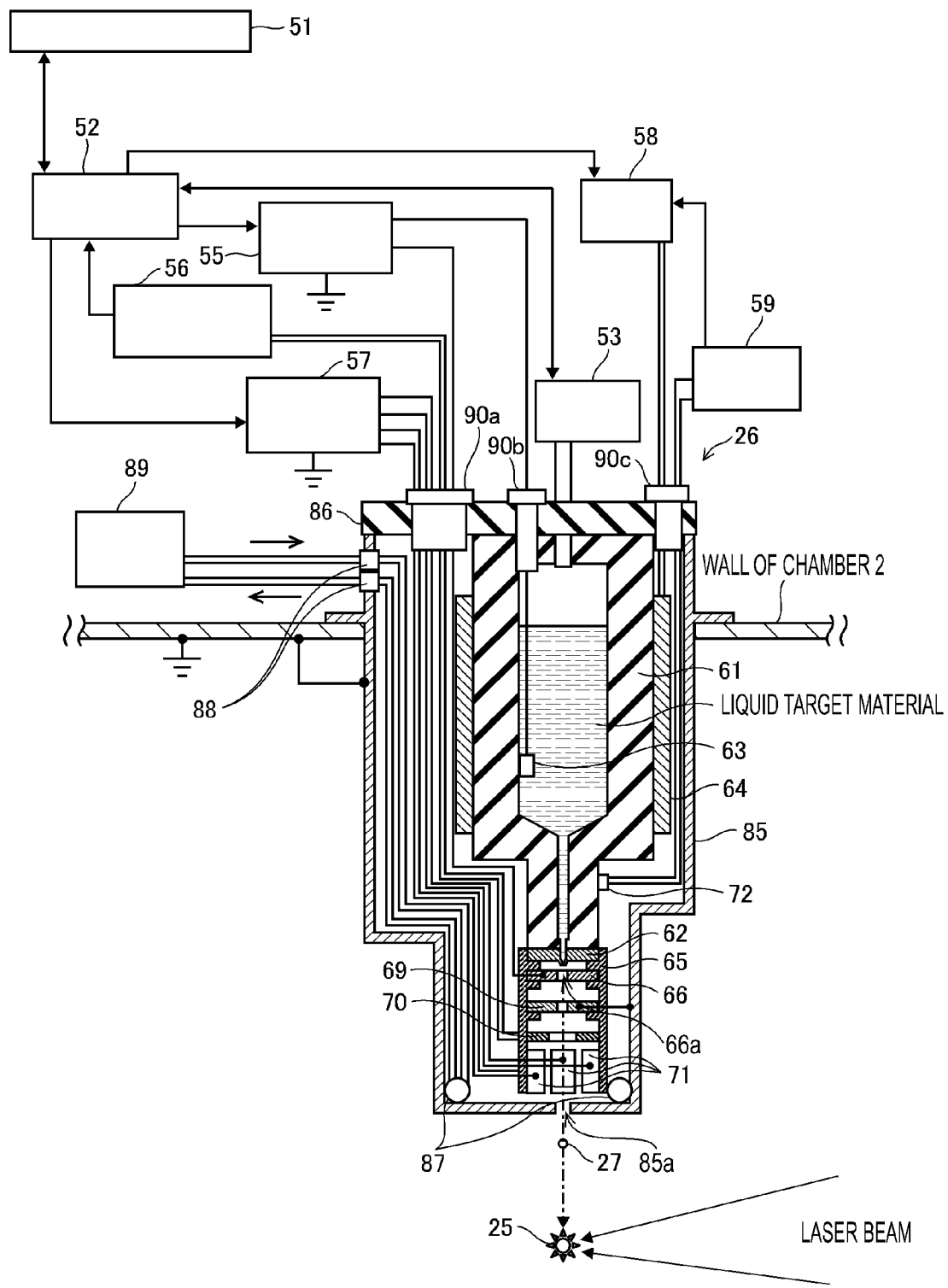
FIG. 10 is a sectional view illustrating a part of a target generator and peripheral components of the target generator included in an EUV light generation apparatus according to a fourth embodiment.

FIG. 10 is a sectional view illustrating a part of a target generator and peripheral components of the target generator included in an EUV light generation apparatus according to a fourth embodiment. The fourth embodiment shown in FIG. 10 may differ from the second embodiment shown in FIG. 4 in the following points. Primary constituent elements of the target generator 26 may be enclosed in a shielding container including a shielding cover 85 and a lid 86 attached to the shielding cover 85.

The shielding cover 85 may have a through-hole 85a formed therein, through which the targets 27 may travel toward the plasma generation region 25. The shielding cover 85 may shield electrical insulators, such as the electrical insulator 65, from charged particles emitted from plasma generated in the plasma generation region 25.

The shielding cover 85 may be formed of an electrically conductive material (such as metal), and may be connected electrically to an electrically conductive structural member (such as a wall) of the chamber 2 either directly or through an electrically conductive connecting member, such as a wire. The electrically conductive structural member of the chamber 2 may be connected electrically to the reference potential of the pulse voltage generator 55, or may further be grounded as well.

The shielding container may cover at least the reservoir 61, the nozzle 62, the electrical insulator 65, and the pull-out electrode 66, and preferably the acceleration electrode 69, a target sensor 70, deflection electrodes 71, and a temperature sensor 72. Piping 87 may be provided on the shielding cover 85 for allowing a heat carrier to circulate in the piping 87 for cooling the shielding cover 85. The piping 87 may be connected to a chiller 89 through a joint 88, and the heat carrier cooled by the chiller 89 may circulate in the piping 87. Here, the piping 87 may be provided on either an outer surface or an inner surface of the shielding cover 85.

The reservoir 61 may be formed of an electrically conductive material such as molybdenum (Mo), a semiconductor material such as silicon carbide (SiC), or an electrically non-conductive material such as synthetic quartz or alumina. Similarly, the nozzle 62 may be formed of an electrically conductive material such as molybdenum (Mo), a semiconductor material such as silicon carbide (SiC), or an electrically non-conductive material such as synthetic quartz or alumina.

The reservoir 61 may be attached to the lid 86. The lid 86 may be formed of an electrically non-conductive material, such as mullite. Further, the target sensor 70 for detecting a target 27 passing therethrough may be disposed downstream from the acceleration electrode 69 in the direction in which the target 27 travels. The deflection electrodes 71 for deflecting a target 27 may be disposed downstream from the target sensor 70. In that case, the target sensor 70 and the deflection electrodes 71 may be held by the electrical insulator 65.

Wiring of the pull-out electrode 66, wiring of the target sensor 70, and the wiring of the deflection electrodes 71 may be connected respectively to the pulse voltage generator 55, a target detection circuit 56, and a deflection electrode voltage generator 57 through a relay terminal 90a provided in the lid 86. Wiring of the acceleration electrode 69 may be connected electrically to the shielding cover 85 or to the reference potential of the pulse voltage generator 55 through wiring (not shown) and a relay terminal (not shown).

Wiring of the electrode 63 for applying a voltage signal to the liquid target material may be connected to the pulse voltage generator 55 through a relay terminal 90b provided in the lid 86. Wiring of the heater 64 and wiring of the temperature sensor 72 may be connected respectively to a heater power source 58 and a temperature controller 59 through a relay terminal 90c provided in the lid 86.

10.2 Operation

As a current flows in the heater 64 from the heater power source 58, the heater 64 may heat the reservoir 61. The temperature controller 59 may receive a detection signal from the temperature sensor 72, and control the current to be flowed in the heater 64 from the heater power source 58. The temperature of the reservoir 61 may be controlled to be at or above the melting point of tin.

The target control device 52 may receive a target passage signal from the target detection circuit 56, and may control the pressure adjuster 53, the pulse voltage generator 55, and the deflection electrode voltage generator 57 based on the received target passage signal.

More specifically, the target control device 52 may be configured to output a target generation signal to the pulse voltage generator 55. With this, a charged target 27 may be outputted through the nozzle 62. The charged target 27 outputted through the nozzle 62 may travel through the through-hole 66a formed in the pull-out electrode 66 and through the through-hole formed in the acceleration electrode 69. Further, when the charged target 27 passes through the target sensor 70, a current may flow in the target sensor 70. The target detection circuit 56 may generate a target passage signal by amplifying the current, and may output the target passage signal to the target control device 52. When the output time of the charged target, the speed of the charged target, the distance between the tip of the nozzle 62 and the target sensor 70, and the inclination of the target sensor 70 with respect to the trajectory of the charged target are known, the target control device 52 may calculate the point at which the target 27 has passed the detection part of the target sensor 70 based on the timing of the target passage signal. By carrying out such calculation, the target control device 52 may determine the position (trajectory) of the target 27.

A pair of deflection electrodes 71 may be provided downstream from the target sensor 70 for deflecting the trajectory of the charged target. When the target 27 needs to be deflected, the target control device 52 may output a control signal to the deflection electrode voltage generator 57 for controlling a potential difference to be applied between the deflection electrodes 71. The target 27 may be deflected based on a control signal from the EUV light generation control device 51 and/or the control signal from the target control device 52. Here, various signals may be transmitted between the EUV light generation control device 51 and the target control device 52.

The target 27 which has passed through the pair of deflection electrodes 71 may pass through the through-hole 85*a* formed in the shielding cover 85 toward the plasma generation region 25. When the target 27 reaches the plasma generation region 25, the target 27 may be irradiated by a laser beam, whereby the target 27 may be turned into plasma and EUV light may be emitted from the plasma. The shielding cover 85 which may be exposed to radiation heat and/or charged particles, such as ions and electrons emitted from the plasma, may be cooled by a heat carrier flowing in the piping 87 to prevent overheating in the shielding cover 85. Here, the heat carrier may be cooled by the chiller 89 and circulate in the piping 87.

10.3 Effect

According to the fourth embodiment, the electrically non-conductive structural members around the reservoir 61 and the nozzle 62 may be covered by the shielding container. Accordingly, the electrically non-conductive structural members may be prevented from being exposed to the charged particles by the shielding container. The shielding cover 85 of the shielding container may be connected to the reference potential; thus, fluctuations in the potential distribution (electric field) along the trajectory of the charged targets may be reduced, which may result in the improvement in the positional stability of the charged targets traveling inside the chamber.

Figure 11:
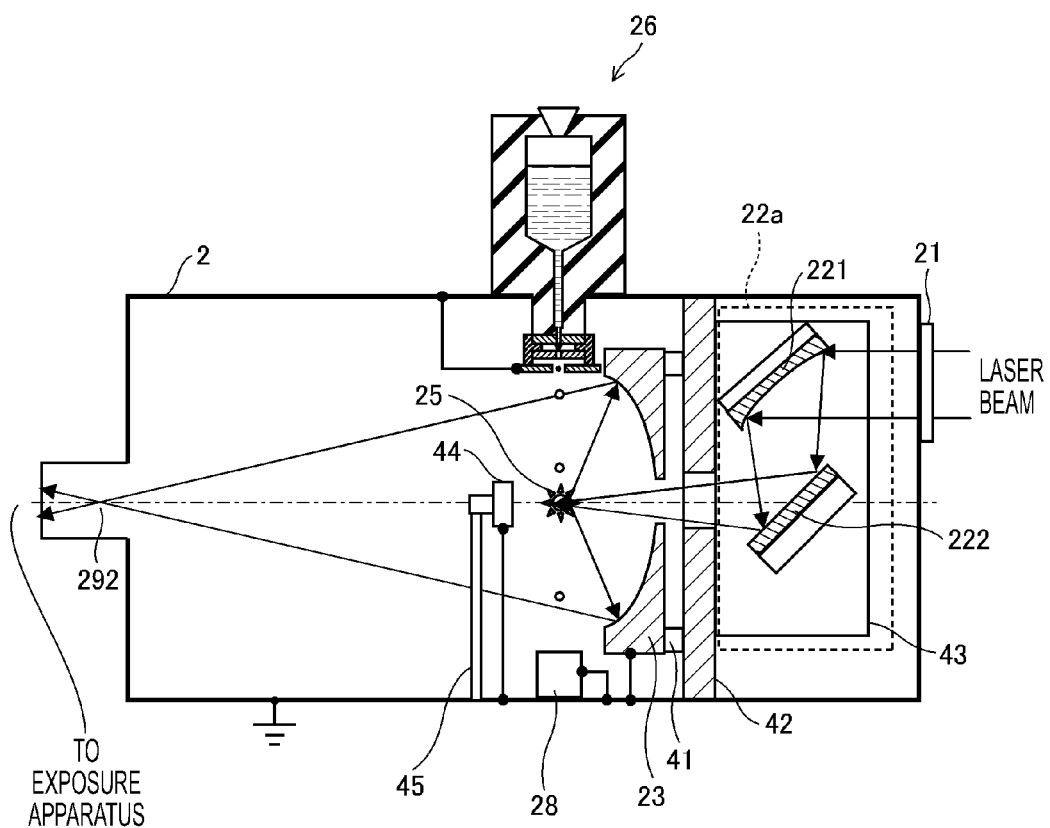
FIG. 11 is a partial sectional view illustrating the configuration of an EUV light generation apparatus according to a fifth embodiment.

11. Embodiment Where Members around Target Trajectory Are Connected to Reference Potential FIG. 11 is a partial sectional view illustrating the configuration of an EUV light generation apparatus according to a fifth embodiment. In the fifth embodiment shown in FIG. 11, members provided around the trajectory of the targets may be connected to the reference potential, which is the same as the potential of the chamber 2. That is, members which can not be covered from the charged particles emitted from the plasma by a shielding cover or the like, while securing their functionality, may be connected to the reference potential, whereby the charges of the charged particles adhered to these members may be released to the chamber 2 and so forth.

As illustrated in FIG. 11, the laser beam focusing optical system 22*a*, the EUV collector mirror 23, the target collector 28, the EUV collector mirror mount 41, the plates 42 and 43, the beam dump 44, the beam dump support member 45 may be provided inside the chamber 2.

The substrate of the EUV collector mirror 23, the target collector 28, and the beam dump 44 may preferably be formed of metal or ceramics having electrically conductive properties. The substrate of the EUV collector mirror 23, the target collector 28, and the beam dump 44 may be connected electrically to an electrically conductive structural member (such as the wall) of the chamber 2 through an electrically conductive connecting member, such as a wire.

A portion of the charged particles emitted from the plasma may reach the EUV collector mirror 23, the target collector 28, and/or the beam dump 44. However, since the EUV collector mirror 23, the target collector 28, and the beam dump 44 may be connected to the reference potential, these members may be prevented from being charged. Accordingly, fluctuations in the potential distribution along the trajectory of the charged targets may be reduced, which may result in the improvement in the positional stability of the charged targets traveling inside the chamber.

In the fifth embodiment, the EUV collector mirror 23, the target collector 28, and the beam dump 44 may be connected electrically to the electrically conductive structural member of the chamber 2 via an electrically conductive connection member. However, this embodiment is not limited thereto, and the EUV collector mirror 23, the target collector 28, and the beam dump 44 may be attached to the chamber 2 so as to be in contact with a member having high electrically conductive properties. For example, by forming the EUV collector mirror mount 41 and the plate 42 with a metal material, the EUV collector mirror 23 can be connected electrically to the electrically conductive structural member of the chamber 2 through the EUV collector mirror mount 41 and the plate 42.

12. Embodiment Where Electrode Is Provided in Target Collector

Figure 12:
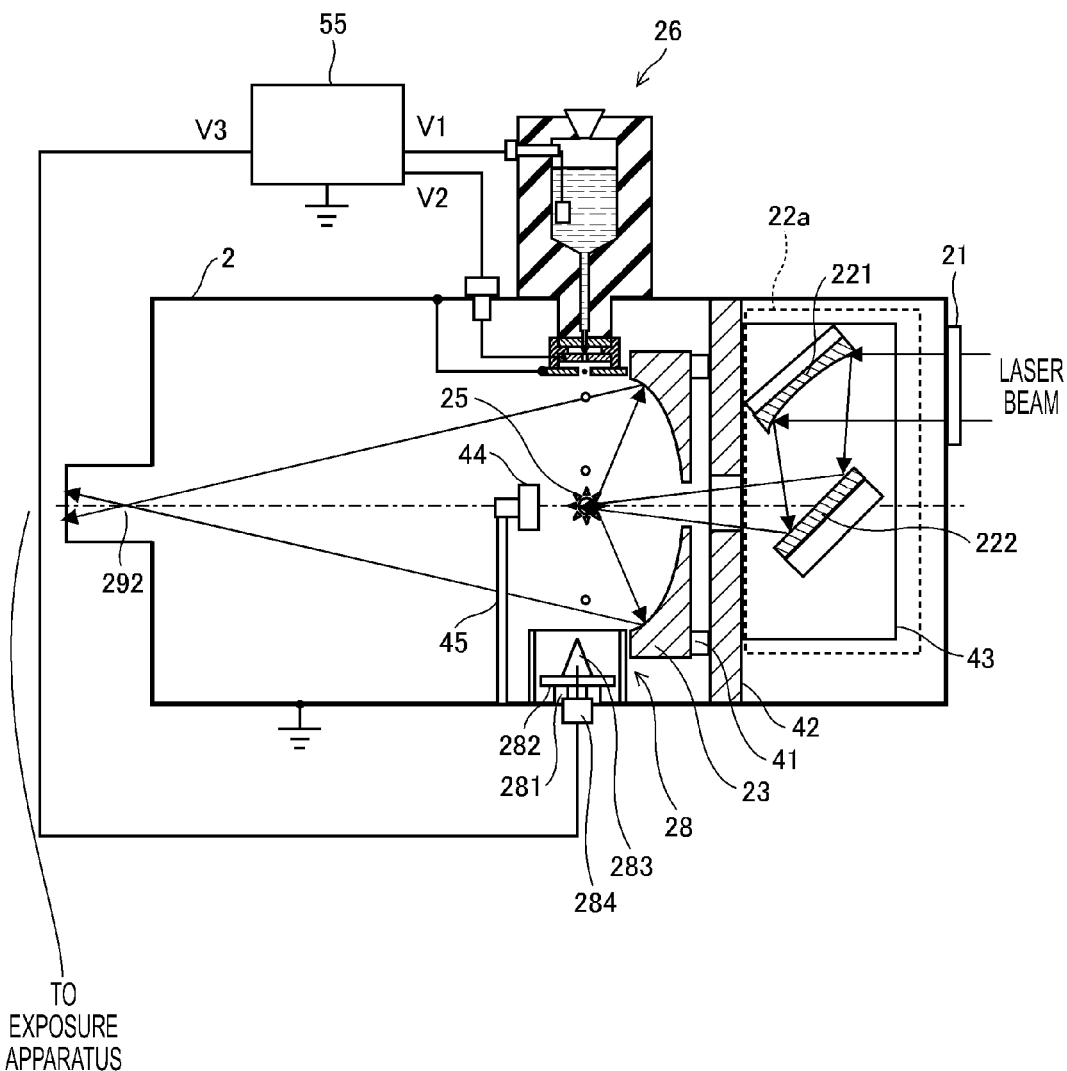
FIG. 12 is a partial sectional view illustrating the configuration of an EUV light generation apparatus according to a sixth embodiment.

FIG. 12 is a partial sectional view illustrating the configuration of an EUV light generation apparatus according to a sixth embodiment. In the sixth embodiment shown in FIG. 12, the target collector 28 may include an electrically non-conductive support member 281, an electrically conductive shielding plate 282, and a receiving electrode 283. The receiving electrode 283 may be connected to the pulse voltage generator 55 through the shielding plate 282 and a connection terminal 284.

The pulse voltage generator 55 may vary a voltage signal V1 applied to the liquid target material between the reference potential and a potential P1 (10 kV, for example). Further, the pulse voltage generator 55 may retain a voltage signal V2 applied to the pull-out electrode 66 at the reference potential and retain a voltage signal V3 applied to the receiving electrode 283 at a potential P3 (−10 kV, for example). Here, the potentials P1 and P3 may satisfy the following relationship.

$$P3<0(\text{potential of chamber})<P1$$

For example, the receiving electrode 283 retained at the potential P3 may be disposed at substantially the center of the target collector 28, which may be cylindrical in shape. The receiving electrode 283 may be conical in shape. Further, the receiving electrode 283 may be attached to the chamber 2 through the support member 281 and the shielding plate 282. With this, the receiving electrode 283 may be insulated from the chamber 2 by the support member 281. Further, the support member 281 may be protected from the charged particles emitted from the plasma by the shielding plate 282. Here, the shielding plate 282 may be retained at the potential P3 as well.

According to the sixth embodiment, the charged targets may be attracted to the target collector 28 through electrostatic force. Further, the shielding plate 282 may shield the support member 281 from the charged particles, whereby fluctuations in the potential distribution (electric field) along the trajectory of the charged targets may be reduced.

Here, the target has been charged positively, but this embodiment is not limited thereto, and the target may be charged negatively. If this is the case, the potentials P1 and P3 may satisfy the following relationship.

$$P1<0 (\text{potential of chamber}) <P3$$

13. Embodiment Where Heating Unit Is Provided to Shielding Member

Figure 13:
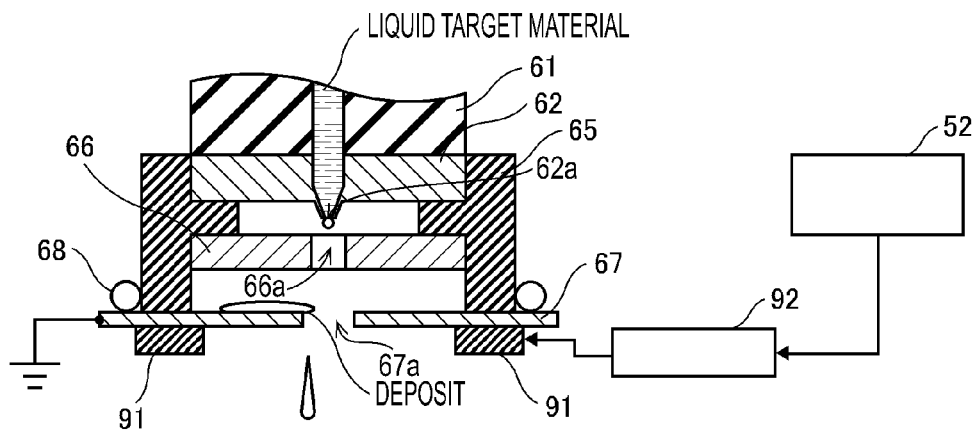
FIG. 13 is a sectional view illustrating a part of a target generator and peripheral components of the target generator included in an EUV light generation apparatus according to a seventh embodiment.

FIG. 13 is a sectional view illustrating a part of a target generator and peripheral components of the target generator included in an EUV light generation apparatus according to a seventh embodiment. In the seventh embodiment shown in FIG. 13, a heater 91 serving as a heating unit may be provided on a shielding member (shielding plate 67, for example), and a heater power source 92 for supplying a current to the heater 91, and a temperature sensor (not shown) may be provided. In the seventh embodiment, the shielding plate 67 may be connected electrically to an electrically conductive structural member of the chamber 2 (reference potential).

In the target generator shown in FIG. 13, a target material may adhere to an inner surface of a space between the pull-out electrode 66 and the shielding plate 67, and the target material may be cooled and turned into a solid deposit. In some cases, the solid deposit may cover the through-hole 67a formed in the shielding plate 67, and a target outputted through the nozzle 62 may be blocked thereby. As a result, the target may not be outputted toward the plasma generation region 25. Accordingly, in the seventh embodiment, a heater 91 may be provided on the shielding plate 67, and the solid deposit (target material) may be heated to a temperature at or above the melting point of the target material. As such, the target material may melt and be removed from the surface.

The heater power source may supply a current to the heater 91 under the control of the target control device 52. For example, the target control device 52 may control the heater power source 92 to supply the current to the heater 91, when the target is not detected by the target sensor 4 (See FIG. 1) although the target output signal is outputted from the EUV light generation control device 51 (maintenance mode).

Figure 14:
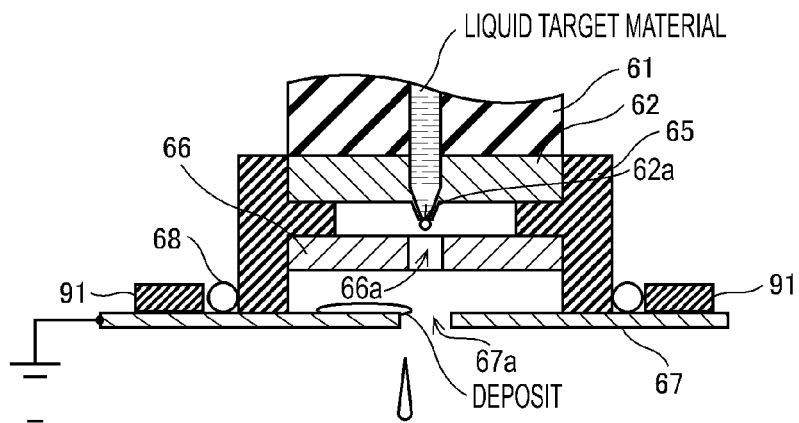
FIG. 14 is a sectional view illustrating a part of a target generator included in an EUV light generation apparatus according to a first modification of the seventh embodiment.

FIG. 14 is a sectional view illustrating a part of a target generator included in an EUV light generation apparatus according to a first modification of the seventh embodiment. In the seventh embodiment shown in FIG. 13, the heater 91 may be provided on a bottom surface of the shielding plate 67 (downstream side in the direction in which the target travels); however, in the first modification shown in FIG. 14, the heater 91 may be provided on an upper surface of the shielding plate 67 (upstream side in the direction in which the target travels). According to the first modification, the shielding plate 67 may shield the heater 91 from radiant heat and/or charged particles emitted from the plasma. With this, the lifetime of the heater 91 may be extended.

Figure 15:
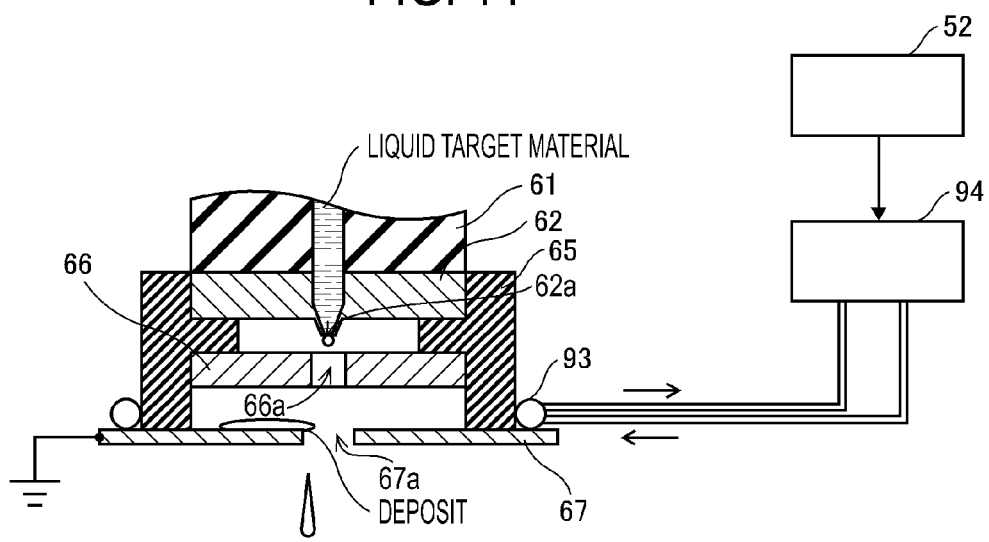
FIG. 15 is a sectional view illustrating a part of a target generator and peripheral components of the target generator included in an EUV light generation apparatus according to a second modification of the seventh embodiment.

FIG. 15 is a sectional view illustrating a part of a target generator and peripheral components of the target generator included in an EUV light generation apparatus according to a second modification of the seventh embodiment. In the second modification shown in FIG. 15, piping 93 may be provided, as a heating unit, on a shielding member, such as the shielding plate 67, and a heat carrier may be made to circulate in the piping 93. With this, the deposit (target material) may be heated to a temperature at or above the melting point of the target material. As a result, the target material may melt and be removed from the surface.

More specifically, a heat carrier circulation device 94 may be connected to the piping 93 for heating or cooling the heat carrier and allowing the heat carrier to circulate in the piping 93. Under the control of the target control device 52, the heat carrier circulation device 94 may heat the heat carrier when the shielding plate 67 needs to be heated and may allow the heat carrier to circulate in the piping 93. Similarly, the heat carrier circulation device 94 may cool the heat carrier when the shielding plate 67 needs to be cooled and may allow the heat carrier to circulate in the piping 93. In this way, the piping 93 and the heat medium circulation device 94 may serve as both a heating unit and a cooling unit.

14. Continuous-Jet Type Target Generator

14.1 Configuration

Figure 16A:
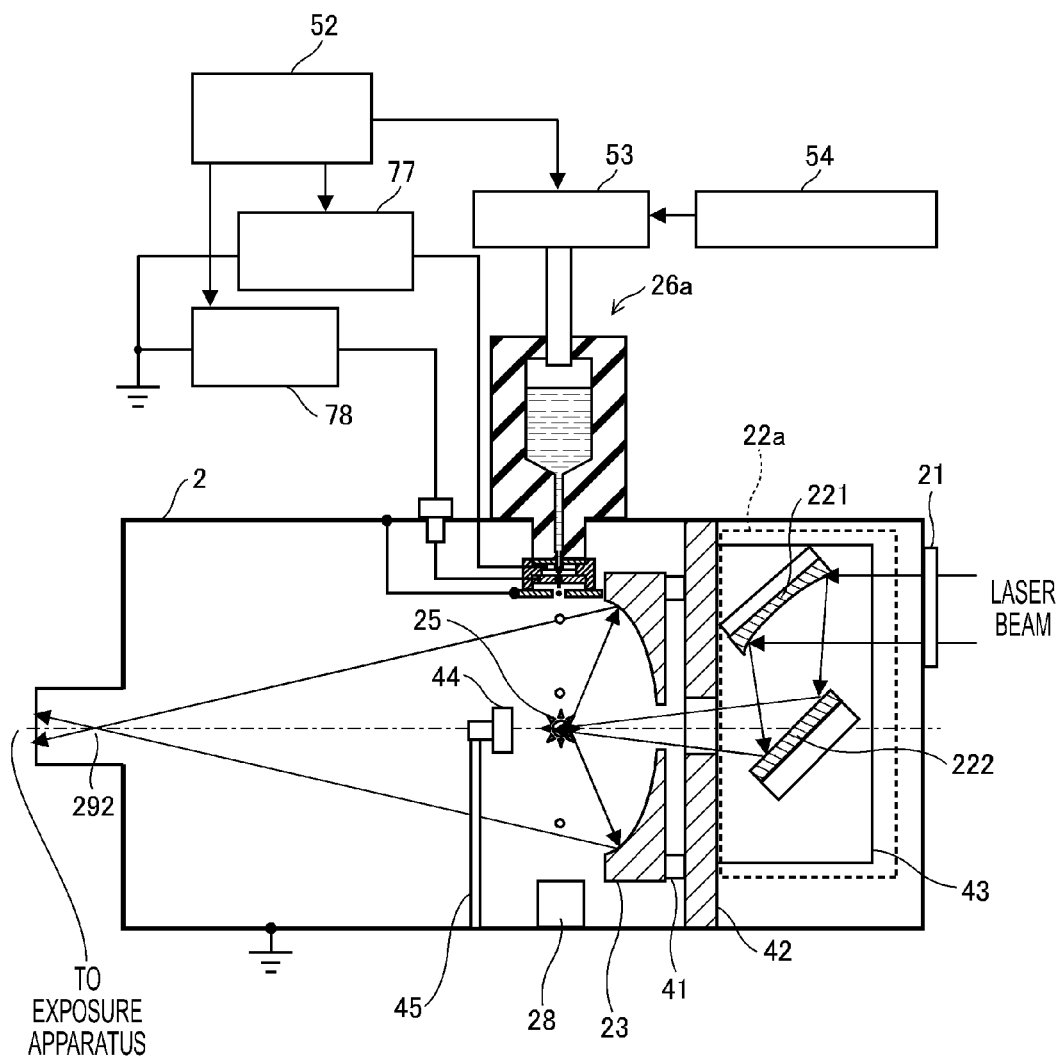
FIG. 16A is a partial sectional view illustrating the configuration of an EUV light generation apparatus according to an eighth embodiment.
Figure 16B:
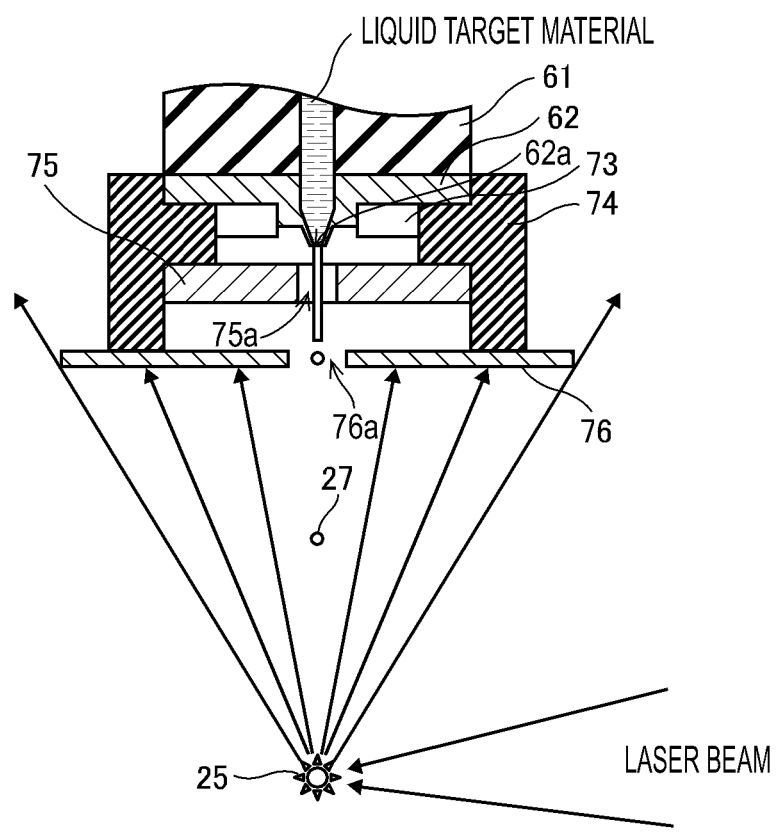
FIG. 16B is an enlarged sectional view illustrating a part of the target generator shown in FIG. 16A.

FIG. 16A is a partial sectional view illustrating the configuration of an EUV light generation apparatus according to an eighth embodiment; and FIG. 16B is an enlarged sectional view illustrating a part of the target generator shown in FIG. 16A. A continuous-jet type target generator 26a may differ from the electrostatic-pull-out type target generator 26 (See FIG. 2) in the following points.

With reference to FIGS. 16A and 16B, an actuator 73 including a piezoelectric element, such as lead zirconate titanate (PZT), may be provided on the nozzle 62 of the target generator 26a. The actuator 73 may be provided near the tip portion of the nozzle 62. The actuator 73 may be connected to an actuator driving circuit 77. Further, a charging electrode 75 having a through-hole 75a formed therein, through which a target 27 travels, may be provided downstream from the nozzle 62. The charging electrode 75 may be connected to a charging electrode power source 78.

The target generator 26a may include the reservoir 61, the nozzle 62, the actuator 73, an electrical insulator 74, the charging electrode 75, and a shielding plate 76. The electrical insulator 74 may be provided on the nozzle 62 and may hold the charging electrode 75 and the shielding plate 76. The shielding plate 76 may have a through-hole 76a formed therein, through which a target 27 travels toward the plasma generation region 25. The shielding plate 76 may include an electrically conductive material, and be connected electrically to the electrically conductive structural member of the chamber 2 through an electrically conductive connecting member, such as a wire.

14.2 Operation

An inert gas may be supplied into the reservoir 61 of the target generator 26a at predetermined pressure. With this, a jet of the liquid target material may be discharged through the nozzle 62. The actuator driving circuit 77 may output a driving signal to the actuator 73, and the actuator 73 may add vibration to the nozzle 62 at a predetermined frequency in accordance with the driving signal from the actuator driving circuit 77. When the actuator 73 causes the nozzle 62 to vibrate, a tip portion of the jet of the liquid target material may be divided periodically, whereby targets 27 may be generated. The charging electrode 75 may charge the targets 27 at the timing at which each target 27 is divided from the jet of the liquid target material. Accordingly, the charging electrode 75 may be provided at a position where the jet of the liquid target material is divided into individual targets 27. The charging electrode power source 78 may apply either a positive or negative potential to the charging electrode 75. The charging electrode 75 may cause an electric field to act on the targets 27, whereby the target 27 may become charged. When the potential of the charging electrode 75 is retained above the potential of the liquid target material, the target 27 may become charged negatively. On the other hand, when the potential of the charging electrode 75 is retained below the potential of the liquid target material, the target 27 may become charged positively. The charged targets 27 may travel through the through-hole 76a formed in the shielding plate 76 and reach the plasma generation region 25.

14.3 Effect

According to the eighth embodiment, charged particles emitted in the plasma generation region 25 may be prevented from reaching the electrical insulators, such as the electrical insulator 74, provided on the target generator 26a by the shielding plate 76. The shielding plate 76 may be connected to the reference potential. Thus, fluctuations in the potential distribution (electric field) along the trajectory of the charged targets may be reduced, which may result in the improvement in the positional stability of the charged targets traveling inside the chamber 2.

15. Supplementary Descriptions

15.1 Detecting Charged Target Using Magnetic Circuit

Figure 17:
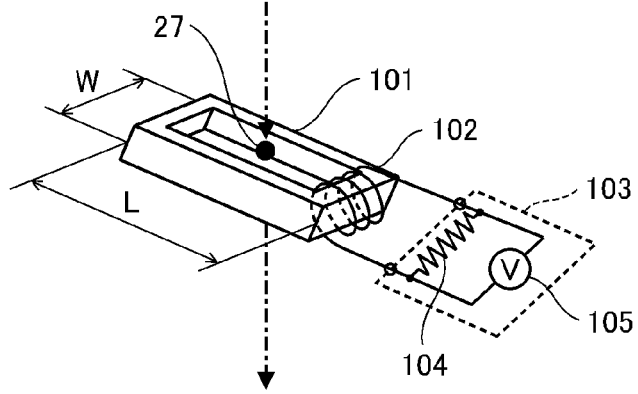
FIG. 17 illustrates an example of the configuration of a target sensor for detecting a charged target.

FIG. 17 illustrates an example of the configuration of a target sensor for detecting a charged target. As illustrated in FIG. 17, a magnetic core 101 constituting a closed loop magnetic circuit may have a coil 102 wound thereon, and the two ends of the coil 102 may be connected to an ammeter 103. The ammeter 103 may include a resistance 104 connected between two input terminals and a voltmeter 105 for measuring a voltage between the two ends of the resistance 104. When a charged target 27 passes through the closed loop of the magnetic circuit, a magnetic field may be generated in the magnetic circuit in accordance with Ampere's law, and electromotive force may be generated in the coil 102 by the magnetic field in accordance with Faraday's law of electromagnetic induction. With this, a current may flow in the coil 102. The current may be measured by the ammeter 103, and the timing at which the current flows can be detected.

The magnetic core 101 may be formed of ferromagnet. For example, ferrite magnet, neodymium magnet, samarium-cobalt magnet, soft iron, or the like may be used. Here, the smaller the magnetic circuit is, the greater the current flows in the coil 102. Further, the larger the charge amount of the charged target, the greater the current flows in the coil 102.

In order to detect the timing at which a charged target 27 passes through the magnetic core 101 with high precision, the dimensions of one example of the magnetic core 101 may be approximately 0.6 mm in width and approximately 0.85 mm in length. Further, in order to increase the charge amount of a charged target, the electrostatic-pull-out type target generator may preferably be used.

In the example shown in FIG. 17, the magnetic core 101 may be rectangular in shape. However, the present disclosure is not limited thereto, and the magnetic core 101 may be in any shape such as, circular, polygonal, elliptical, and so forth. In other words, it is sufficient as long as the magnetic circuit is formed so that the magnetic core 101 has a closed loop and the magnetic core 101 is positioned so that the trajectory of the charged targets intersects with a plane along the closed loop of the magnetic circuit. Here, when the magnetic circuit is positioned such that the trajectory of the charged targets intersects with the plane along the closed loop of the magnetic circuit at an angle other than 90 degrees, the timing at which a charged target passes through the magnetic circuit may correlate with the position at which the charged target passes through the closed loop. Accordingly, the position at which the charged target passes through the closed loop may be calculated based on the timing of the target passage signal. The position at which the charged target passes through the closed loop may easily be calculated by measuring, in advance, the speed of the charged target, the distance from the tip of the nozzle 62 to the target sensor 70, the angle at which the target sensor 70 is inclined with respect to the trajectory of the charged target.

15.2 Controlling Direction of Target Using Deflection Electrodes

Figure 18:
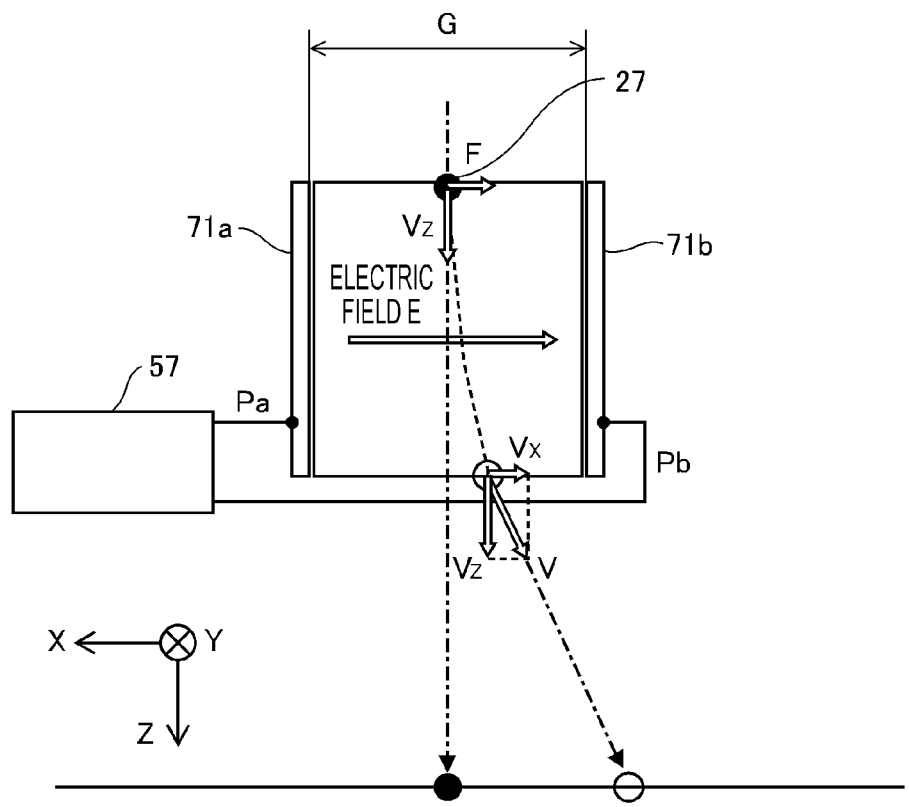
FIG. 18 is a diagram for explaining a method for controlling the direction of a target using deflection electrodes.

FIG. 18 is a diagram for explaining a method for controlling the direction of a target using deflection electrodes. Here, a charged target 27 moving in Z-direction may be deflected by an electric field acting in X-direction (shown by the arrow pointed in direction marked $V_x$) using a pair of flat electrodes serving as the deflection electrodes 71a and 71b.

A target having a charge Q may be subjected to force F expressed in the following expression in the direction of the electric field E.

$$F = QE$$

Here, the electric field E may be expressed in the following expression by a potential difference (Pa−Pb) between a potential Pa applied to an flat electrode 71a and a potential Pb applied to a flat electrode 71b, and the length G of a gap between the flat electrodes 71a and 71b.

$$E = (Pa - Pb)/G$$

When a charged target 27 enters the electric field with an initial speed Vo, the charged target 27 may be subjected to the force F in the direction of the electric field E, whereby the direction in which the charged target travels may be deflected. The charged target 27 may be accelerated in X-direction by the force F while moving in Z-direction with Z-direction velocity component Vz (Vz=V0).

$$F = ma (m\text{:mass of target}, a\text{:acceleration})$$

The target 27 may be subjected to the force F while moving in the electric field.

The speed V of the charged target 27 when the charged target 27 exits from the electric field may be expressed in the following expression by the Z-direction velocity component Vz and the X-direction velocity component Vx.

$$V = (Vz^2 + Vx^2)^{1/2}$$

The charged target 27 that has exited from the electric field may move at a speed V and arrive at a position at which the charged target 27 is to be irradiated by a laser beam. Similarly, with respect to the Y-direction, the direction of the target 27 may be controlled by providing a pair of flat electrodes 71a, 71b in the Y-direction.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as at least one or "one or more."

What is claimed is:

1. An apparatus for generating extreme ultraviolet light by irradiating a target material by a laser beam from a laser apparatus to turn the target material into plasma, the apparatus comprising:
   a chamber with an inlet for introducing the laser beam into the chamber, the chamber including an electrically conductive structural member; and
   a target generator including:
      an electrode having a first through-hole formed therein, through which a charged target passes,
      an electrical insulator for holding the electrode, and
      a shielding member having a second through-hole formed therein, through which the charged target passes, the shielding member being positioned between a plasma generation region and the electrical insulator, wherein:
   the target generator is configured to generate the charged target of a liquid target material and output the charged target toward the plasma generation region inside the chamber, and
   the shielding member has electrically conductive properties and is connected electrically to the electrically conductive structural member of the chamber.

2. The apparatus according to claim 1, further comprising a pulse voltage generator configured to:
   generate a voltage signal that varies between a first potential, which is higher than a reference potential, and a second potential, which is higher than the first potential,
   apply the reference potential to the electrically conductive structural member of the chamber,
   apply the first potential to the electrode, and
   apply the voltage signal to the liquid target.

3. The apparatus according to claim 1, further comprising a pulse voltage generator configured to:
   generate a voltage signal that varies between a reference potential and a first potential, which is higher than the reference potential,
   apply the reference potential to the electrically structural member of the chamber,
   apply the voltage signal to the electrode, and
   apply a second potential, which is higher than the first potential, to the liquid target material.

4. The apparatus according to claim 1, further comprising a pulse voltage generator configured to:
   generate a voltage signal that varies between a first potential, which is higher than a reference potential, and a second potential, which is higher than the first potential,
   apply the reference potential to the electrically conductive structural member of the chamber,
   apply the voltage signal to the electrode, and
   apply the second potential to the liquid target material.

5. The apparatus according to claim 1, further comprising a connecting member for electrically connecting the shielding member held by the electrical insulator to the electrically conductive structural member of the chamber.

6. The apparatus according to claim 1, wherein the target generator further includes:
   a target storage unit for storing at least the liquid target material thereinside, and
   a target discharge unit having an opening formed therein, through which the liquid target material stored in the target storage unit is discharged, wherein
   the shielding member is attached to the electrically conductive structural member of the chamber and covers at least the target storage unit, the target discharge unit, the electrode, and the electrical insulator inside the chamber.

7. The apparatus according to claim 6, wherein the shielding member and a lid attached to the shielding member forms a container for covering at least the target storage unit, the target discharge unit, the electrode, and the electrical insulator.

8. The apparatus according to claim 1, further comprising a collector mirror for collecting and reflecting the extreme ultraviolet light emitted from the plasma generated by irradiating the target material by the laser beam, wherein
   the collector mirror is electrically conductive and is connected electrically to the electrically conductive structural member of the chamber.

9. The apparatus according to claim 1, further comprising a target collector for collecting a target material that was not turned into plasma, wherein
   the target collector is electrically conductive and is connected electrically to the electrically conductive structural member of the chamber.

10. The apparatus according to any one of claims 2 through 4, further comprising a target collector for collecting a target material that was not turned into plasma, wherein:
   the target collector include a receiving electrode and a support member for supporting the receiving electrode, the support member having electrically non-conductive properties, and
   the pulse voltage generator applies a potential that is lower than the potential of the chamber to the receiving electrode.

11. The apparatus according to claim 1, further comprising a beam dump for absorbing a laser beam that has passed through the plasma generation region, wherein
   the beam dump is electrically conductive and is connected electrically to the electrically conductive structural member of the chamber.

12. An apparatus for generating extreme ultraviolet light by irradiating a target material by a laser beam from a laser apparatus to turn the target material into plasma, the apparatus comprising:
   a chamber with an inlet for introducing the laser beam into the chamber, the chamber including an electrically conductive structural member;
   a target generator including:
      an electrode having a first through-hole formed therein, through which a charged target passes,
      an electrical insulator for holding the electrode, and
      a shielding member having a second through-hole formed therein, through which the charged target passes, the shielding member being positioned between a plasma generation region and at least the electrical insulator, wherein:
   the target generator is configured to generate the charged target of a liquid target material and output the charged target toward the plasma generation region inside the chamber, and
   the shielding member has electrically conductive properties and is connected electrically to the electrically conductive structural member of the chamber; and
   a power source configured to:
      apply a reference potential to the electrically conductive structural member of the chamber and to the liquid target material, and
      apply one of positive and negative potentials to the electrode.

* * * * *